(12) United States Patent
Partlow et al.

(10) Patent No.: US 12,144,072 B2
(45) Date of Patent: Nov. 12, 2024

(54) ALL-OPTICAL LASER-DRIVEN LIGHT SOURCE WITH ELECTRODELESS IGNITION

(71) Applicants: Hamamatsu Photonics K.K., Shizuoka (JP); Energetiq Technology, Inc., Wilmington, MA (US)

(72) Inventors: Matthew Partlow, Somerville, MA (US); Donald Smith, Newton, MA (US); Matthew Besen, Andover, MA (US); Akinori Asai, Hamamatsu (JP)

(73) Assignees: Hamamatsu Photonics K.K., Shizuoka (JP); Energetiq Technology, Inc., Wilmington, MA (US)

( * ) Notice: Subject to any disclaimer, the term of this patent is extended or adjusted under 35 U.S.C. 154(b) by 409 days.

(21) Appl. No.: 17/707,109

(22) Filed: Mar. 29, 2022

(65) Prior Publication Data
US 2023/0319959 A1    Oct. 5, 2023

(51) Int. Cl.
*H05B 41/30* (2006.01)
*G02B 27/14* (2006.01)
(Continued)

(52) U.S. Cl.
CPC ............ *H05B 41/30* (2013.01); *G02B 27/141* (2013.01); *H01J 61/16* (2013.01); *H01J 65/00* (2013.01);
(Continued)

(58) Field of Classification Search
CPC ....... H05B 41/30; G02B 27/141; H01J 61/16; H01J 65/00; H01S 3/0602; H01S 3/1115; H01S 3/1623; H01S 3/1643
See application file for complete search history.

(56) References Cited

U.S. PATENT DOCUMENTS 3,054,921 A    9/1962 Lye
3,227,923 A    1/1966 Marrison
(Continued)

FOREIGN PATENT DOCUMENTS

DE    19910725 A1    10/1999
DE    102011113681 A1    3/2013
(Continued)

OTHER PUBLICATIONS

User Manual: Cyberlight, Cyberlight Cx, Cyberlight Sv (Version 2.0), High End Systems, Inc., (1996).
(Continued)

*Primary Examiner* — Nicole M Ippolito
*Assistant Examiner* — Hanway Chang
(74) *Attorney, Agent, or Firm* — Rauschenbach Patent Law Group, PLLC; Kurt Rauschenbach

(57) ABSTRACT

An electrodeless laser-driven light source includes a laser source that generates a CW sustaining light and a pump laser that generates a pump. An optical beam combiner combines the CW sustaining light and the pump such that the CW sustaining light and the pump propagate co-linearly. A Q-switched laser crystal generates pulsed light in response to the pump. A gas-filled bulb is configured such that the pulsed light ignites a pulse plasma in a breakdown region of the gas bulb and the sustaining light sustains a CW plasma in a CW plasma region of the gas bulb, thereby emitting a high brightness light from the gas bulb, where the gas-filled bulb is positioned between the output of the pump laser and the pump input of the Q-switched laser crystal such that the CW plasma absorbs the pump light quenching the pulsed light generated by the Q-switched laser crystal.

30 Claims, 10 Drawing Sheets

(51) Int. Cl.
*H01J 61/16* (2006.01)
*H01J 65/00* (2006.01)
*H01S 3/06* (2006.01)
*H01S 3/1115* (2023.01)
*H01S 3/16* (2006.01)

(52) U.S. Cl.
CPC .......... *H01S 3/0602* (2013.01); *H01S 3/1115* (2013.01); *H01S 3/1623* (2013.01); *H01S 3/1643* (2013.01)

(56) References Cited

U.S. PATENT DOCUMENTS

| | | |
|---|---|---|
| 3,418,507 A | 12/1968 | Young |
| 3,427,564 A | 2/1969 | Okaya |
| 3,495,118 A | 3/1970 | Richter |
| 3,502,929 A | 3/1970 | Richter |
| 3,582,822 A | 6/1971 | Kamey |
| 3,619,588 A | 11/1971 | Chambers |
| 3,636,395 A | 1/1972 | Banes, Jr. |
| 3,641,389 A | 2/1972 | Leidigh |
| 3,657,588 A | 4/1972 | McRae |
| 3,731,133 A | 5/1973 | McRae |
| 3,764,466 A | 10/1973 | Dawson |
| 3,808,496 A | 4/1974 | McRae |
| 3,826,996 A | 7/1974 | Jaegle et al. |
| 3,900,803 A | 8/1975 | Silfvast et al. |
| 3,911,318 A | 10/1975 | Spero |
| 3,949,258 A | 4/1976 | Soodak |
| 3,982,201 A | 9/1976 | Rosenkrantz et al. |
| 4,054,812 A | 10/1977 | Lessner |
| 4,063,803 A | 12/1977 | Wright |
| 4,088,966 A | 5/1978 | Samis |
| 4,152,625 A | 5/1979 | Conrad |
| 4,177,435 A | 12/1979 | Brown |
| 4,179,037 A | 12/1979 | Chan |
| 4,179,566 A | 12/1979 | Nadelson |
| 4,263,095 A | 4/1981 | Thode |
| 4,272,681 A | 6/1981 | Fill |
| 4,485,333 A | 11/1984 | Goldbert |
| 4,498,029 A | 2/1985 | Yoshizawa et al. |
| 4,536,640 A | 8/1985 | Vukanovic |
| 4,599,540 A | 7/1986 | Roberts |
| 4,633,128 A | 12/1986 | Roberts |
| 4,646,215 A | 2/1987 | Levin et al. |
| 4,702,716 A | 10/1987 | Roberts |
| 4,724,352 A | 2/1988 | Schuda |
| RE32,626 E | 3/1988 | Yoshizawa et al. |
| 4,780,608 A | 10/1988 | Cross et al. |
| 4,785,216 A | 11/1988 | Roberts |
| 4,789,788 A | 12/1988 | Cox |
| 4,866,517 A | 9/1989 | Mohizuki |
| 4,868,458 A | 9/1989 | Davenport et al. |
| 4,872,189 A | 10/1989 | Frankel |
| 4,889,605 A | 12/1989 | Asmus |
| 4,901,330 A | 2/1990 | Wolfram et al. |
| 4,978,893 A | 12/1990 | Brannon |
| 5,052,780 A | 10/1991 | Klein |
| 5,153,673 A | 10/1992 | Amirav |
| 5,299,279 A | 3/1994 | Roberts |
| 5,317,618 A | 5/1994 | Nakahara |
| 5,334,913 A | 8/1994 | Ury et al. |
| 5,359,621 A | 10/1994 | Tsunoda |
| 5,418,420 A | 5/1995 | Roberts |
| 5,442,184 A | 8/1995 | Palmer et al. |
| 5,506,857 A | 4/1996 | Meinzer |
| 5,508,934 A | 4/1996 | Moslehi |
| 5,561,338 A | 10/1996 | Roberts |
| 5,672,931 A | 9/1997 | Kiss |
| 5,686,996 A | 11/1997 | Fidler et al. |
| 5,789,863 A | 8/1998 | Takahashi |
| 5,790,575 A | 8/1998 | Zamel et al. |
| 5,801,495 A | 9/1998 | Smolka et al. |
| 5,903,088 A | 5/1999 | Sugitani |
| 5,905,268 A | 5/1999 | Garcia |
| 5,940,182 A | 8/1999 | Lepper |
| 6,005,332 A | 12/1999 | Mercer |
| 6,025,916 A | 2/2000 | Quick |
| 6,061,379 A | 5/2000 | Schoen |
| 6,074,516 A | 6/2000 | Howald |
| 6,108,091 A | 8/2000 | Pecen |
| 6,129,807 A | 10/2000 | Grimbergen |
| 6,181,053 B1 | 1/2001 | Roberts |
| 6,184,517 B1 | 2/2001 | Sawada et al. |
| 6,200,005 B1 | 3/2001 | Roberts |
| 6,212,989 B1 | 4/2001 | Beyer |
| 6,236,147 B1 | 5/2001 | Manning |
| 6,265,813 B1 | 7/2001 | Knox |
| 6,274,970 B1 | 8/2001 | Capobianco |
| 6,275,565 B1 | 8/2001 | Tomie |
| 6,281,629 B1 | 8/2001 | Tanaka |
| 6,285,131 B1 | 9/2001 | Kiss |
| 6,288,780 B1 | 9/2001 | Fairley et al. |
| 6,316,867 B1 | 11/2001 | Roberts |
| 6,331,993 B1 | 12/2001 | Brown |
| 6,339,279 B1 | 1/2002 | Miyamoto |
| 6,339,280 B1 | 1/2002 | Miyamoto |
| 6,351,058 B1 | 2/2002 | Roberts |
| 6,374,012 B1 | 4/2002 | Bergmann et al. |
| 6,400,067 B1 | 6/2002 | Manning |
| 6,400,089 B1 | 6/2002 | Salvermoser |
| 6,414,436 B1 | 7/2002 | Eastlund |
| 6,417,625 B1 | 7/2002 | Brooks et al. |
| 6,445,134 B1 | 9/2002 | Asmus |
| 6,493,364 B1 | 12/2002 | Baumler et al. |
| 6,504,319 B2 | 1/2003 | Herter |
| 6,504,903 B1 | 1/2003 | Kondo |
| 6,532,100 B1 | 3/2003 | Partanen |
| 6,541,924 B1 | 4/2003 | Kane et al. |
| 6,597,087 B2 | 7/2003 | Roberts |
| 6,602,104 B1 | 8/2003 | Roberts |
| 6,670,758 B2 | 12/2003 | Beech |
| 6,737,809 B2 | 5/2004 | Espiau |
| 6,762,849 B1 | 7/2004 | Rulkens |
| 6,768,264 B2 | 7/2004 | Beech |
| 6,788,404 B2 | 9/2004 | Lange |
| 6,816,323 B2 | 11/2004 | Colin et al. |
| 6,821,377 B2 | 11/2004 | Saito |
| 6,834,984 B2 | 12/2004 | Tausch |
| 6,865,255 B2 | 3/2005 | Richardson |
| 6,867,419 B2 | 3/2005 | Tajima |
| 6,914,919 B2 | 7/2005 | Watson |
| 6,956,329 B2 | 10/2005 | Brooks et al. |
| 6,956,885 B2 | 10/2005 | Taylor |
| 6,970,492 B2 | 11/2005 | Govorkov |
| 6,972,421 B2 | 12/2005 | Melnychuk et al. |
| 7,050,149 B2 | 5/2006 | Owa et al. |
| 7,072,367 B2 | 7/2006 | Arisawa |
| 7,087,914 B2 | 8/2006 | Akins et al. |
| 7,158,221 B2 | 1/2007 | Davis |
| 7,164,144 B2 | 1/2007 | Partio et al. |
| 7,176,633 B1 | 2/2007 | Roberts |
| 7,274,435 B2 | 9/2007 | Hiura |
| 7,307,375 B2 | 12/2007 | Smith et al. |
| 7,368,741 B2 | 5/2008 | Melnychuk |
| 7,399,981 B2 | 7/2008 | Cheymol et al. |
| 7,427,167 B2 | 9/2008 | Holder et al. |
| 7,429,818 B2 | 9/2008 | Chang et al. |
| 7,435,982 B2 | 10/2008 | Smith |
| 7,439,497 B2 | 10/2008 | Dantus |
| 7,439,530 B2 | 10/2008 | Ershov |
| 7,456,417 B2 | 11/2008 | Murakami et al. |
| 7,567,607 B2 | 7/2009 | Knowles et al. |
| 7,598,509 B2 | 10/2009 | Ershov |
| 7,632,419 B1 | 12/2009 | Grimgergen |
| 7,652,430 B1 | 1/2010 | Delgado |
| 7,671,349 B2 | 3/2010 | Bykanov |
| 7,679,027 B2 | 3/2010 | Bogatu |
| 7,679,276 B2 | 3/2010 | Blondia |
| 7,680,158 B2 | 3/2010 | Endo |
| 7,705,331 B1 | 4/2010 | Kirk et al. |
| 7,773,656 B1 | 8/2010 | Mills |
| 7,786,455 B2 | 8/2010 | Smith |
| 7,795,816 B2 | 9/2010 | Jennings |

(56) References Cited

U.S. PATENT DOCUMENTS

| | | |
|---|---|---|
| 8,148,900 B1 | 4/2012 | Kirk et al. |
| 8,242,671 B2 | 8/2012 | Blondia |
| 8,242,695 B2 | 8/2012 | Sumitomo |
| 8,253,926 B2 | 8/2012 | Sumitomo |
| 8,309,943 B2 | 11/2012 | Smith |
| 8,320,424 B2 | 11/2012 | Bolt |
| 8,427,067 B2 | 4/2013 | Espiau |
| 8,525,138 B2 | 9/2013 | Smith et al. |
| 8,969,841 B2 | 3/2015 | Smith |
| 9,048,000 B2 | 6/2015 | Smith |
| 9,185,786 B2 | 11/2015 | Smith |
| 9,576,785 B2 | 2/2017 | Blondia |
| 9,609,732 B2 | 3/2017 | Smith |
| 9,678,262 B2 | 6/2017 | Gortz et al. |
| 9,741,553 B2 | 8/2017 | Blondia |
| 9,748,086 B2 | 8/2017 | Blondia |
| 9,922,814 B2 | 3/2018 | Blondia |
| 10,008,378 B2 | 6/2018 | Blondia |
| 10,057,973 B2 | 8/2018 | Blondia |
| 10,078,167 B2 | 9/2018 | Brune et al. |
| 10,109,473 B1 | 10/2018 | Blondia et al. |
| 10,186,414 B2 | 1/2019 | Blondia |
| 10,186,416 B2 | 1/2019 | Blondia |
| 10,203,247 B2 | 2/2019 | Brady et al. |
| 10,217,625 B2 | 2/2019 | Bezel et al. |
| 10,222,701 B2 | 3/2019 | Zhao et al. |
| 10,770,282 B1 | 9/2020 | Abramenko et al. |
| 2001/0035720 A1 | 11/2001 | Guthrie |
| 2002/0021508 A1 | 2/2002 | Ishihara |
| 2002/0036820 A1 | 3/2002 | Merriam |
| 2002/0044624 A1 | 4/2002 | Davis et al. |
| 2002/0044629 A1 | 4/2002 | Hertz et al. |
| 2002/0080834 A1 | 6/2002 | Kusunose |
| 2002/0172235 A1 | 11/2002 | Chang et al. |
| 2003/0006383 A1 | 1/2003 | Melnychuk |
| 2003/0034736 A1 | 2/2003 | Eastlund |
| 2003/0052609 A1 | 3/2003 | Eastlund et al. |
| 2003/0068012 A1 | 4/2003 | Ahmad et al. |
| 2003/0086139 A1 | 5/2003 | Wing So |
| 2003/0090902 A1 | 5/2003 | Kavanaugh |
| 2003/0147499 A1 | 8/2003 | Kondo |
| 2003/0168982 A1 | 9/2003 | Kim |
| 2003/0193281 A1 | 10/2003 | Manning |
| 2003/0231496 A1 | 12/2003 | Sato et al. |
| 2004/0008433 A1 | 1/2004 | Margeson |
| 2004/0016894 A1 | 1/2004 | Wester |
| 2004/0018647 A1 | 1/2004 | Jones |
| 2004/0084406 A1 | 5/2004 | Kamp |
| 2004/0108473 A1 | 6/2004 | Melnychuk |
| 2004/0129896 A1 | 7/2004 | Schmidt et al. |
| 2004/0134426 A1 | 7/2004 | Tomoyasu |
| 2004/0183031 A1 | 9/2004 | Silverman |
| 2004/0183038 A1 | 9/2004 | Hiramoto et al. |
| 2004/0026512 A1 | 12/2004 | Otsubo |
| 2004/0238762 A1 | 12/2004 | Mizoguchi et al. |
| 2004/0239894 A1 | 12/2004 | Shimada |
| 2004/0264512 A1 | 12/2004 | Hartlove et al. |
| 2005/0057158 A1 | 3/2005 | Chang et al. |
| 2005/0167618 A1 | 8/2005 | Hoshino et al. |
| 2005/0168148 A1 | 8/2005 | Allen |
| 2005/0199829 A1 | 9/2005 | Partlo et al. |
| 2005/0205803 A1 | 9/2005 | Mizoguchi |
| 2005/0205811 A1 | 9/2005 | Partlo et al. |
| 2005/0207454 A1 | 9/2005 | Starodoumov |
| 2005/0225739 A1 | 10/2005 | Hiura |
| 2005/0243390 A1 | 11/2005 | Tejnil |
| 2005/0276285 A1 | 12/2005 | Huang et al. |
| 2006/0039435 A1 | 2/2006 | Cheymol et al. |
| 2006/0078017 A1 | 4/2006 | Endo et al. |
| 2006/0103952 A1 | 6/2006 | Gouch |
| 2006/0131515 A1 | 6/2006 | Partlo et al. |
| 2006/0152128 A1 | 7/2006 | Manning |
| 2006/0176925 A1 | 8/2006 | Nakano |
| 2006/0186356 A1 | 8/2006 | Iamii et al. |
| 2006/0192152 A1 | 8/2006 | Ershov et al. |
| 2006/0202625 A1 | 9/2006 | Song |
| 2006/0215712 A1 | 9/2006 | Ziener |
| 2006/0219957 A1 | 10/2006 | Ershov et al. |
| 2006/0255298 A1 | 11/2006 | Bykanov |
| 2007/0001131 A1 | 1/2007 | Ershov |
| 2007/0228288 A1 | 10/2007 | Smith |
| 2007/0228300 A1 | 10/2007 | Smith |
| 2007/0285921 A1 | 12/2007 | Zulim et al. |
| 2008/0048133 A1 | 2/2008 | Bykanov |
| 2008/0055712 A1 | 3/2008 | Noelscher |
| 2008/0059096 A1 | 3/2008 | Stenstrom |
| 2009/0032740 A1 | 2/2009 | Smith et al. |
| 2009/0196801 A1 | 8/2009 | Mills |
| 2009/0267003 A1 | 10/2009 | Moriya |
| 2009/0314967 A1 | 12/2009 | Moriya |
| 2010/0164380 A1 | 7/2010 | Sumitomo |
| 2010/0181503 A1 | 7/2010 | Yanagida |
| 2010/0253935 A1 | 10/2010 | MacKinnon et al. |
| 2010/0264820 A1 | 10/2010 | Sumitomo |
| 2011/0181191 A1 | 7/2011 | Smith et al. |
| 2011/0204265 A1 | 8/2011 | Smith et al. |
| 2011/0291566 A1 | 12/2011 | Bezel |
| 2014/0117258 A1 | 5/2014 | Smith |
| 2015/0021500 A1 | 1/2015 | Smith |
| 2015/0289353 A1 | 10/2015 | Smith |
| 2016/0057845 A1 | 2/2016 | Smith |
| 2017/0135192 A1 | 5/2017 | Blondia |
| 2017/0150590 A1 | 5/2017 | Chimmalgi et al. |
| 2019/0037676 A1 | 1/2019 | Khodykin et al. |
| 2019/0045615 A1 | 2/2019 | Mori et al. |
| 2019/0053364 A1 | 2/2019 | Mori et al. |
| 2019/0075641 A1 | 3/2019 | Kuritsyn et al. |
| 2019/0021158 A1 | 7/2019 | Nozaki |
| 2020/0012165 A1 | 1/2020 | Haller |
| 2020/0393687 A1 | 12/2020 | Yabu et al. |
| 2021/0120659 A1 | 4/2021 | Szilagyi et al. |
| 2022/0229307 A1 | 7/2022 | Wang et al. |
| 2022/0375740 A1 | 11/2022 | Partlow et al. |

FOREIGN PATENT DOCUMENTS

| | | |
|---|---|---|
| EP | 1083777 A9 | 3/2001 |
| EP | 2534672 B1 | 6/2016 |
| FR | 1471215 A | 3/1967 |
| FR | 2554302 A1 | 5/1985 |
| GB | 2266406 a | 10/1993 |
| JP | 53-103395 A | 9/1978 |
| JP | 61-193358 A | 8/1986 |
| JP | 1-296560 A | 11/1989 |
| JP | 4-144053 A | 5/1992 |
| JP | 5-82087 A | 4/1993 |
| JP | H05-82087 B2 | 11/1993 |
| JP | 8-299951 A | 11/1996 |
| JP | 9-288995 A | 11/1997 |
| JP | 2003-317675 | 11/2003 |
| JP | 2004-134166 A | 4/2004 |
| JP | 2006-010675 | 1/2006 |
| JP | 2006-080255 A | 3/2006 |
| JP | 4255662 B2 | 4/2009 |
| JP | 2010-087388 | 4/2010 |
| JP | 2010-171159 A | 8/2010 |
| JP | 6243845 B2 | 12/2017 |
| KR | 10-2005-0003392 A | 1/2005 |
| KR | 10-2006-0064319 A | 6/2006 |
| KR | 10-2006-0087004 A | 8/2006 |
| KR | 10-2008-0108111 A | 12/2008 |
| KR | 10-2010-0114455 A | 10/2010 |
| KR | 10-2016-0071231 A | 6/2016 |
| KR | 10-1639963 B1 | 7/2016 |
| NL | 8403294 A | 6/1985 |
| RU | 2266628 C2 | 12/2005 |
| RU | 2278483 C2 | 6/2006 |
| RU | 2326463 C2 | 6/2008 |
| RU | 2780202 C1 | 9/2022 |
| WO | 94/10729 A1 | 5/1994 |
| WO | 98/11388 A1 | 3/1998 |
| WO | 98/54611 A2 | 12/1998 |
| WO | 99/18594 A1 | 4/1999 |
| WO | 02/087291 A2 | 10/2002 |

(56) References Cited

FOREIGN PATENT DOCUMENTS

| WO | 03/079391 | A2 | 9/2003 |
|---|---|---|---|
| WO | 2004/023061 | A2 | 3/2004 |
| WO | 2004/084592 | A2 | 9/2004 |
| WO | 2004/097520 | A2 | 11/2004 |
| WO | 2005/004555 | | 1/2005 |
| WO | 2007/002170 | A2 | 1/2007 |
| WO | 2010/093903 | A2 | 8/2010 |
| WO | 2018/136683 | A1 | 7/2018 |
| WO | 2019/023150 | A1 | 1/2019 |
| WO | 2019/023303 | A1 | 1/2019 |
| WO | 2022/159352 | A1 | 7/2022 |
| WO | 2022/251000 | A1 | 12/2022 |

OTHER PUBLICATIONS

Ushio Super-High Pressure Mercury Lamps, including USH-102D, USH-102DH, USH-205DP, USH-2055, USH-206D/M4, USH-250D, USH-250BY, USH-350DS, USH-351DS, USH-350DP, USH-450G5, USH-450GL, USH-500BY,USH-500MB, USH-502MB, USH-500T, USH-505MC, USH-5085, USH-508SA, USH-5095, USH-1000DW,USH-1000MC, USH-1000KS, USH-1002DW, Ushio.
Vadla et al., "Resonantly Laser Induced Plasmas in Gases: The Role of Energy Pooling and Exothermic Collisions in Plasma Breakdown and Heating", Spectrochimica Acta Part B, vol. 65, 2010, pp. 33-45.
Vampola, "P78-2 Engineering Overview", Defence Technical Information Centre, 1981, pp. 1-36.
Vukanovic et al., "A New Type of D.C. Arc as Spectrochemical Light Source", Spectrochimica Acta, vol. 29B, 1974, pp. 33-36.
Wang, "Self-Assembled Indium Arsenide Quantum-Dash Lasers of Indium Phosphide Substrates", Electrical and Computer Engineering, 2002, pp. vi-150.
Waynant et al., "Electro-Optics Handbook", Eds., 20002, pp. 1-1000.
Webb et al., "Handbook Of Laser Technology and Applications", Applications, vol. III, 2004, pp. 1587-1611.
Wei, "Transparent Ceramic Lamp Envelope Materials", J. Phys. D: Appl. Phys., vol. 38, 2005, pp. 3057-3065.
Weinrotter et al., "Application of Laser Ignition to Hydrogen-Air Mixtures at High Pressures", International Journal of Hydrogen Energy, vol. 30, 2005, pp. 319-326.
Weinrotter et al., "Laser Ignition of Engines", Laser Physics, vol. 15, No. 7,2005, pp. 947-953.
Wiehle et al., "Dynamics of Strong-Field Above-Threshold Ionization of Argon: Comparison Between Experiment and Theory", Physical Review A, vol. 67, 2003, pp. 063405-1-063405-7.
Wieman et al., "Using Diode Lasers for Atomic Physics", Rev. Sci. Instrum., vol. 62, No. 1, 1991, pp. 1-20.
Wilbers et al., "The Continuum Emission of an Arc Plasma," J. Quant. Spectrosc. Radiat. Transfer, vol. 45, No. 1, 1991, pp. 1-10.
Wilbers et al., "The VUV Emissivity of a High-Pressure Cascade Argon Arc from 125 to 200 nm," J. Quant. Spectrosc. Radiat. Transfer, vol. 46, 1991, pp. 299-308.
Winter et al., "Experimental and Theoretical Investigations of a Helium-Xenon Discharge in Spot Mode", 28th ICGQP, 2007 pp. 1979-1982.
Wood, "Atomic Processes: Bound-bound transitions (Einstein coefficients)", available at http://www-star.st-and.ac.uk-kw25/teaching/nebulae/lecture06_einstein.pdf, 2014, pp. 1-10.
World Record Powers Achieved in Single-Mode Fiber Lasers—Powers Scalable to IkW and Beyond, Southampton Photonics, Inc., 2003, pp. 1-2.
Wroblewski et al., "An Experimental Investigation of the Continuous Optical Discharge", Journal of Physique, 1979, pp. 733-734.
Wu et al., "Extreme Ultraviolet Lithography: Towards the Next Generation of Integrated Circuits", vol. 7, 2009, pp. 1-4.
Xenakis et al., "Laser-plasma X-ray Generation Using an Injection-mode-locked XeCl Excimer Laser", J. Appl. Phys., vol. 71, No. 1, 1992, pp. 85-93.

Xu et al., "Wavelength- and Time-Resolved Investigation of Laser-Induced Plasmas as a Continuum Source", Applied Spectroscopy, vol. 47, No. 8, 1993, pp. 1134-1139.
Yamada et al., "Ionization Mechanism of Cesium Plasma Produced by Irradiation of Dye Laser",vol. 31, 1992, pp. 377-380.
Schohl et al., "Absolute Detection of Metastable Rare Gas Atoms by a CW Laser Photoionization Method", Z. Phys. D—Atoms, Molecules and Clusters, vol. 21, 1991, pp. 25-39.
Yamanaka, "Inertial Confinement Fusion Research at ILE Osaka", Nuclear Fusion, vol. 25, No. 9, 1985, pp. 1343-1349.
Shaw et al., "Preliminary Design of Laser-Induced Breakdown Spectroscopy for Proto-Material Plasma Exposure Experiment", Review of Scientific Instruments, vol. 85, 2014, pp. 11D806-1-11D806-3.
Shen et al., "Highly Efficient Er, Yb-Doped Fiber Laser with 188W Free-Running and >100W Tunable Output Power", Optics Express, vol. 13, No. 13, 2005, pp. 4916-4921.
Shigeyoshi et al., "Near Infrared Absorptions of Neon, Argon, Krypton, and Xenon Excited Diatomic Molecules", J. Chem. Phys., vol. 68, 1978, pp. 7595-4603.
Shimada et al., "Characterization of Extreme Ultraviolet Emission from Laser-Produced Spherical Tin Plasm Generated with Multiple Laser Beams", Applied Physics Letters, vol. 86, 2005, pp. 051501-1-051501-3.
Shirakawa et al., "CW 7-W, 900-nm-wide Supercontinuum Source by Phosphosilicate Fiber Raman Laser and Highnonlinear Fiber", Proceedings of SPIE, vol. 5709, 2005, pp. 199-205.
Sidawi, "Fiber Lasers Gain Power", www.rdmag.com, 2003, p. 26.
Silfvast et al., "Comparison of Radiation from Laser-Produced and DC-Heated Plasmas in Xenon", Applied Physics Letters, vol. 25, No. 5, 1974, pp. 274-277.
Silfvast, Laser Fundamentals, Schhol of Optics, 2004, pp. 1-6, pp. 199-222 & 565-568.
Skenderovic et al., "Laser-ignited glow discharge in lithium vapor", Physical Review A, vol. 62, 2000, pp. 052707-1-052707-7.
Smith, "Gas-Breakdown Dependence on Beam Size and Pulse Duration with 10.6-μ Wavelength Radiation", Applied Physics Letters, vol. 19, No. 10, 1971, pp. 405-408.
Snyder et al., "Laser-Induced Breakdown Spectroscopy of High-Pressure Bulk Aqueous Solutions", Applied Spectroscopy, vol. 60, No. 7, 2006, pp. 786-790.
Sobota et al., "The Role of Metastables in the Formation of an Argon Discharge in a Two-Pin Geometry", IEEE Transactions on Plasma Science, vol. 38, No. 9, 2010, pp. 2289-2299.
Song et al., "Mechanisms of Absorption in Pulsed Excimer Laser-Induced Plasma", Appl. Phys. A, vol. 65, 1997, pp. 477-485.
Stamm, "Extreme Ultraviolet Light Sources for use in Semiconductor Lithography—State of the Art and Future Development", J. Phys. D: Appl. Phys., vol. 37, 2004, pp. 3244-3253.
Stulen et al., "Developing A Soft X-Ray Projection Lithography Tool", AT & T Technical Journal, 1991, pp. 37-48.
Su et al., "Note: A Transient Absorption Spectrometer Using an Ultra Bright Laser-Driven Light Source", Review of Scientific Instruments, vol. 84, 2013, pp. 086106-1-386106-3.
Sundvold et al., "Optical Firing System", Proc. of SPIE, vol. 5871, 2005, pp. 587104-1-587104-10.
Super-Quiet Xenon Lamp Super-Quiet Mercury-Xenon Lamp, Hamamatsu Product Information, Nov. 2005, 16 pages.
Surzhikov, "Numerical Simulation of Subsonic Gasdynamical Instabilities Near Heat Release Regions", AIAA, 1996, pp. 1-11.
Yamakoshi et al., "Extreme-Ultraviolet Laser Photo-Pumped by a Self-Healing Hg Target",SPIE, Vo.. 2015, 1994, pp. 227-231.
Szymanski et al., "Nonstationary Laser-Sustained Plasma", Journal of Applied Physics, vol. 69, No. 6, 1990, pp. 3480-3484.
Szymanski et al., "Spectroscopic Study of a Supersonic Jet of Laser-Heated Argon Plasma", J. Phys. D: Appl. Phys., vol. 30, 1997, pp. 998-1006.
Takahashi et al., "Numerical Analysis of Ar(2) Excimer Production in Laser-Produced Plasmas", Journal of Applied Physics, 1998, pp. 390-393.
Takahashi et al., "Ar(2) Excimer Emission from a Laser-Heated Plasma in a High-Pressure Argon Gas", Applied Physics Letters, vol. 77, No. 5, 2000, pp. 4115-4117.

(56) References Cited

OTHER PUBLICATIONS

Tam et al., "Plasma Production in a Cs Vapor by a Weak cw Laser Beam at 6010 A, Optics Communications", vol. 21, No. 3, 1977, pp. 403-407.
Tam, "Dynamic Response of a cw Laser-produced Cs Plasma to Laser Modulations", Appl. Phys. Lett., vol. 35, No. 9, 1979, pp. 683-685.
Tam, "Quasiresonant Laser-Produced Plasma: An Efficient Mechanism for Localized Breakdown", J. Appl. Phys., vol. 51, No. 9, 1980, pp. 4682-4687.
Tanaka et al., "Production of Laser-Heated Plasma in High-Pressure Ar Gas and Emission Characteristics of Vacuum Ultraviolet Radiation from Ar(2) Excimers", Appl. Phys. B, vol. 74, 2002, pp. 323-326.
Tansu, "Novel Quantum-Wells GaAs-Based Lasers for All Transmission Windows in Optical Communication", 2003, pp. i-291.
Theriault et al., "A Real-Time Fiber-Optic LIBS Probe for the In Situ Delineation of Metals in Soils", Field Analytical Chemistry and Technology, vol. 2, No. 2, 1998, pp. 117-125.
Theriault et al., "Field Deployment of a LIBS Probe for Rapid Delineation of Metals in Soils", SPIE, vol. 2835, 1996, pp. 83-88.
Thermoelectric Cooler Controller, Analog Devices Inc., 2002, pp. 1-24.
Tichenor et al., "Soft-x-ray projection lithography experiments using Schwarzschild imaging optics", Applied Optics, vol. 32, No. 34, 1993, pp. 7068-7071.
Tombelaine, et al. "Spectrally Shaped Light From Supercontinuum Fiber Light Sources", Optics Communications, vol. 284, Issue 7, Apr. 1, 2011, pp. 1970-1974.
Tooman, "The Sandia Laser Plasma Extreme Ultraviolet and Soft X-ray (XUV) Light Source", SPIE vol. 664, 1986, pp. 186-191.
Topanga Advanced Plasma Lighting APL1000-4000SF, p. 1.
Topanga Advanced Plasma Lighting APL1000-5000SF, p. 1.
Topanga Advanced Plasma Lighting APL250-4000BF, p. 1.
Topanga Advanced Plasma Lighting APL250-4000SF, p. 1.
Topanga Advanced Plasma Lighting APL250-5500SF, p. 1.
Topanga Advanced Plasma Lighting APL400-4000BF, p. 1.
Topanga Advanced Plasma Lighting APL400-4000SF, p. 1.
Topanga Advanced Plasma Lighting APL400-5500BF, p. 1.
Topanga Advanced Plasma Lighting APL400-5500SF, p. 1.
Topanga's Advanced Plasma Lighting System, Topanga USA, 2016, pp. 1-5.
Treshchalov et al., "Spectroscopic Diagnostics of Pulsed Discharge in High-Pressure Argon", Quantum Electrics, vol. 40, No. 3, 2010, pp. 234-240.
Tsuboi et al., "Nanosecond Imaging Study on Laser Ablation of Liquid Benzene", Appl. Phys. Lett, vol. 64, 1994, pp. 2745-2747.
Uhlenbusch, et al., "Hβ-Line Profile Measurements in Optical Discharges", J. Quant. Spectrosc. Radiat. Transfer vol. 44, No. 1, 1990, pp. 47-56.
Ballard et al., "High-Power, Laser-Produced-Plasma EUV Source", Proc. SPIE, vol. 4688, 2002, pp. 302-309.
Chen et al., "High-temperature Operation of Periodic Index Separate Confinement Heterostructure Quantum Well Laser", Apll. Phys. Lett., vol. 59, No. 22, 1991, pp. 2784-2786.
Coffey, "Fiber Lasers Achieve World-Record Powers", 2003, pp. 13-14.
Coherent, "Conduction-Cooled Bar Packages (CCPs), 965-985 nm", 2015, pp. 1-4.
Cohn et al., "Magnetic-Field-Dependent Breakdown of CO2-Laser-Produced Plasma", Appl. Phys. Lett., vol. 20, No. 6, 1972, pp. 225-227.
Cooley et al., "Fundamentals of Discharge Initiation in Gas-Fed Pulsed Plasma Thrusters", The 29th International Electric Propulsion Conference, Princeton University, 2005, pp. 1-11.
Cooper, "Spectroscopic Identification of Water-Oxygen and Water-Hydroxyl Complexes and their Importance to Icy Duter Solar System Bodies", Chemistry School of Biomedical and Chemical Sciences, 2004, pp. 1-116.
Cremers et al., "Evaluation of the Continuous Optical No. 4, 1985, pp. 665-679. Discharge for Spectrochemical Analysis," Spectrochimica Acta, vol. 40B, No. 4, 1985, pp. 665-679.
Cross et al., "High Kinetic Energy (1-10eV) Laser Sustained Neutral Atom Beam Source", Nuclear Instruments and Methods in Physics Research B13, 198, pp. 658-662.
Cu-Nguyen et al., "Tunable Confocal Hyperspectral Imaging System", Optical MEMS and Nanophotonics, 2013, pp. 9-10.
Cu-Nguyen et al., "Tunable Hyperchromatic Lens System for Confocal Hyperspectral Sensing", Optics Express, vol. 21, No. 13, 2013, pp. 27611-27621.
Daily et al., "Two-Photon Photoionization of the Ca 4s3d(1)D(2) Level in an Optical Dipole Trap", Physical Review A, vol. 71, 2005, pp. 043406-1-343406-5.
Davis, "Lasers and Electra-Optics: Fundamentals and Engineering", 1996, pp. 1-35.
De Jong et al., "A Pulsed Arc-Glow Hollow Cathode Lamp", Spectroehimlea Acta, vol. 29B, 1974, pp. 179-190.
Demtroder, "Laser Spectroscopy: Basic Concepts and Instrumentation", Second Enlarged Edition, 1982, pp. 395-398.
Derra et al., "UHP Lamp Systems for Projection Applications", J. Phys. D: Appl. Phys. vol. 38, 2005, pp. 2995-3010.
DET25K—GaP Detector, 150-550 nm, 1 ns Rise Time, 4.8 mm2, 8-32 Taps, Thorlabs, 2005, p. 1.
Digonnet, "Rare-Earth-Doped Fiber Lasers and Amplifiers", Optical Engineering, 2001, pp. 144-170.
Diwakar et al., "Role of Laser Pre-Pulse Wavelength and Inter-Pulse Delay on Signal Enhancement in Collinear Double-Pulse Laserlinduced Breakdown Spectroscopy", Spectrochimia Acta, Part B, 2013, pp. 65-73.
Dorsch et al., "Performance and Lifetime of High-Power Diode Lasers and Diode Laser Systems", Proc. SPIE, vol. 3628, 1999, pp. 56-63.
Dorsch et al., "2 kW cw Fiber-coupled Diode Laser System", Proceedings of SPIE vol. 3889, 2000, pp. 45-53.
Durfee III et al., "Development of a Plasma Waveguide for High-Intensity Laser Pulses", Physical Review E, vol. 51, No. 3, 1995, pp. 2368-2389.
Dusterer et al., "Optimization of EUVRradiation Yield from Laser-Produced Plasma", Appl. Phys., B-73, 2001, pp. 693-698.
Eckstrom et al., "Microwave Interactions With Plasmas", IEEE Trans. Plasma Sci. vol. 18, 1992, pp. 1-9 with appendixes.
Edmund Optics, Lens UV-SCX 25MM DIA X 25MM FL Uncoated (Drawing), p. 1.
Eletskii et al., "Formation kinetics and parameters of a photoresonant plasma", Soy. Phys. JETP, vol. 67, No. 5, 1988, pp. 920-924.
Emmett et al., "Direct Measurement of Xenon Flashtube Opacity", Journal of Applied Physics, vol. 35, No. 9, 1964, pp. 2601-2604.
Endo et al., "Laser Produced EUV Light Source Development for HVM", SPIE Advanced Lithography, 2007, pp. 1-25.
Erskine et al., "Measuring Opacity of Shock Generated Argon Plasmas", J. Quart Spectro. Radial Transfer, vol. 51, No. 12, 1994, pp. 97-100.
F10T/F10T2 and F6 Lightshield Systems Parts Listing, Heraeus Noblelight America LLC, 2015, pp. 1-12.
F300S/F300SQ UV Lamp System Parts Listing, Heraeus Noblelight America LLC, 2015, pp. 1-26.
Feng et al., "A stigmatic Ultraviolet-Visible Monochromator for Use with a High Brightness Laser Driven Plasma Light Source", Review of Scientific Instruments, vol. 84, 2013, pp. 1-6.
Fiedorowicz et al., "X-Ray Emission form Laser-Irradiated Gas Puff Targets," Appl. Phys. Lett., vol. 62, No. 22, May 31, 1993, pp. 2778-2780.
Fomenkov et al., "Laser Produced Plasma Light Source for EUVL", Cymer Inc., 17075 Thommint Court, San Diego, CA 92127, USA, 2011, pp. 1-6.
Franzen, "Continuous Laser-Sustained Plasmas", 1973, J. Appl. Phys., vol. 44, pp. 1727-1732.
Franzen, "CW Gas Breakdown in Argon Using 10.6-μm Laser Radiation," Appl. Phys. Lett., vol. 21, No. 2, Jul. 15, 1972, pp. 62-64.

(56) References Cited

OTHER PUBLICATIONS

Frey et al., "Spectroscopy and kinetics of the ionic cesium flouride excimer excited by a Laser-Produced Plasma", Journal of the Optical Society of America B, vol. 6, No. 8, 1989, pp. 1529-1535.
Fujimoto et al., "High Power InGaAs/AlGaAs laser Diodes with Decoupled Confinement Heterostructure", SPIE vol. 3628, 1999, pp. 38-45.
Galvanauskas, "Fiber laser based EUV lithography sources", Panel discussion presentation at the SEMATECH EUV Source Workshop (2007).
Geisler et al., "Spectrometer System Using a Modular Echelle Spectrograph and a Laser-Driven Continuum Source for Simultaneous Multi-Element Determination by Graphite Furnace Absorption Spectrometry", Spectrochimica Acta Part B, vol. 107, 2015, pp. 11-16.
Generalov et al., "Experimental Investigation of a Continuous 1972, pp. 763-769. Optical Discharge," Soviet Physics JETP, vol. 34, No. 4, Apr. 1972, pp. 763-769.
Gentile et al., "Oxidative Decontamination of Tritiated Materials Employing Ozone Gas", PPPL, 2002, pp. 1-9.
Gentile et al., "Tritium Decontamination of TFTR D-T Graphite Tiles Employing Ultra Violet Light and a Nd:YAG Laser", Japan Atomic Energy Research Institute, 1999, p. 321-322.
George et al., "13.5 nm EUV Generation from Tin-doped Droplets Using a Fiber Laser", Optics Express, vol. 15, No. 25, 2007, pp. 16348-16356.
Girard et al., "Generating Conditions of a Laser-Sustained Argon Plasma Jet",J. Phys. D: Appl. Phys., vol. 26, 1993, pp. 1382-1393.
Glangetas, "New Design for a Microwave Discharge Lamp", Rev. Sci. Instrum., vol. 51, No. 3, 1980, pp. 390-391.
Griem, "Plasma Spectroscopy", 1964, pp. 172-176.
Gullikson et al., "A Soft X-Ray/EUV Reflectometer Based on a Laser Produced Plasma Source", Journal: Journal of X-Ray Science and Technology, vol. 3, No. 4, 1992, pp. 283-299.
Gwyn, "EVU Lithography Update: The timeline puts the screws to extreme ultraviolet lithography, but engineers rise to the challenge", SPIE, 2002, pp. 1-4.
Hadal et al., "Influence of Ambient Gas on the Temperature and Density of Laser Produced Carbon Plasma", Appl. Phys. Lett. vol. 72, No. 2, 1998, pp. 167-169.
Hanselman, "Laser-Light Thomson and Rayleigh Scattering in Atmospheric-Pressure Laboratory Plasmas", 1993, Department of Chemistry, pp. ii-385.
Hansson et al., "Liquid-Xenon-Jet Laser-Plasma Source for EUV Lithography", SPIE, vol. 4506, 2001, pp. 1-8.
Hansson, "Laser-Plasma Sources for Extreme-Ultraviolet Chaps. 5 & 6", 2003, pp. 1-58.
Harris, "A Century of Sapphire Crystal Growth Proceedings", Proceedings of the 10th DoD Electromagnetic Windows Symposium Norfolk, 2004, pp. 1-56.
Harris, "Review of Navy Program to Develop Optical Quality Diamond Windows and Domes", Naval Air Systems Command, 2002, pp. 1-16.
Harrison et al., "Low-threshold, cw, All-solid-state Ti:Al2O3 Laser", Optics Letter, vol. 16, No. 8, 1991, pp. 581-583.
Hawke et al., "An Apparatus for High Pressure Raman Spectroscopy", Rev. Sci. Instrum., vol. 45, No. 12, 1974, pp. 1598-1601.
Haysom, "Quantum Well Intermixing of InGaAs(P)/InP Heterostructures", Department of Physics, 2001, pp. ii-224.
Hebner et al., "Measured Pressure Broadening and Shift Rates of the 1.73 μm (5d[3/2]1-6p[5/2]2) Transition of Xenon", Applied Physics Letters, vol. 59, No. 9, 1991, pp. 537-539.
Hecht, "Fiber Lasers: Fiber Lasers: The state of the art", Laser Focus World, 2012, pp. 1-11.
Hecht, "Refraction", Optics (Third Edition), Chapter 4, 1998, pp. 100-101.
High Power Diode Laser, Rofin-Sinar Technologies, Inc., 2000, pp. 1-26.
Horn et al., "Evaluation and Design of a Solid-State 193 nm OPO-Nd:YAG Laser Ablation System", Spectroch mica Acta Part B, vol. 58, 2003, pp. 1837-1846.
Hou et al., "Fiber Laser for EUV Generation", EUV Source Workshop, 2006.
Hou et al., "High Intensity Fiber Lasers: Emerging New Applications and New Fiber Technologies", IEEE LEOS Newsletter, 2007, pp. 22-25.
Hou et al., "High Power Fiber Laser Driver for Efficient EUV Lithography Source with Tin-Doped Water Droplet Targets", Optics Expres,, vol. 16, No. 2, 2008, pp. 965-974.
Hu et al., "Laser Induced Stabilisation of the Welding Arc", 2005, Science and Technology of Welding and Joining, vol. 10, No. 1, pp. 76-81.
Huffman et al., "Absorption Coefficients of Xenon and Argon in the 600-1025 Angstrom Wavelength Regions", The Journal of Chemical Physocs, vol. 39, 1963, pp. 902-909.
Hughes, "Plasmas and Laser Light", University of Essex, 1975, pp. 200-272.
I.M. Beterov et al. "Resonance radiation plasma (photoresonance plasma)", Soy. Phys. Usp. vol. 31, No. 66, 1988, pp. 535-554.
Instruction Manual: LDC-3722 Laser Diode Controller, ILX Lightwave Corporation, 1990, pp. 1-1-4-33.
Generalov et al., "Continuous Optical Discharge," ZhETF Pis. Red. 11, No. 9, May 5, 1970, pp. 302-304.
Jin et al., New Laser Plasma Source for Extreme-Ultraviolet, 1995, pp. 2256-2258.
Jahier et al.,"Implementation of a Sapphire Cell with External Electrodes for Laser Excitation of a Forbidden Atomic Transition in a Pulsed E-Field", Eur. Phys. J.D., vol. 13, 2001, pp. 221-229.
Jansson et al., "Liquid-Tin-Jet Laser-Plasma Extreme Ultraviolet Generation", Applied Physics Letters, vol. 84, No. 13, 2004, pp. 2256-2258.
Jaroszynski et al., "Radiation Sources Based on Laser-Plasma Interactions", Phil. Trans. R. Soc. vol. 364,2006, pp. 689-710.
Jauregui et al., "High-power fibre Lasers", Nature Photonics, vol. 7, 2013, pp. 861-867.
Jeng et al., "Theoretical Investigation of Laser-Sustained Argon Plasmas," J. Appl. Phys., vol. 60, No. 7, Oct. 1, 1986, pp. 2272-2279.
Jinno et al., "Luminance and efficacy improvement of low-pressure xenon pulsed fluorescent lamps by using an auxiliary external electrode", J. Phys. D: Appl. Phys., vol. 40, 2007, pp. 3889-3895.
Jinno et al., "The Afterglow Characteristics of Xenon Pulsed Plasma for Mercury-Free Fluorescent Lamps", Czech. J. Phys., vol. 50, 2000, pp. 433-436.
Johnson, "Ultraviolet Emission Spectra of High-Pressure Rare Gases", 1970, Journal of the Optical Society of America,, vol. 60, No. 12, pp. 1669-1674.
Joshi et al., "Laser-Induced Breakdown Spectroscopy for In-Cylinder Equivalence Ratio Measurements in Laser-Ignited Natural Gas Engines", Applied Spectroscopy, vol. 63, No. 5, 2009, pp. 549-554.
Kaku et al., "Vacuum Ultraviolet Spectroscopic System Using a Laser-Produced Plasma", Journal of Applied Physics, vol. 42, 2003, pp. 3458-3462.
Kaku et al., "Vacuum Ultraviolet Transmission Spectroscopic System using a Laser-Produced Plasma", The Japan Society of Applied Physics, vol. 42, No. 6R, pp. 149-152.
Keefer et al., "Experimental Study of a Stationary Laser-Sustained Air Plasma," Journal of Applied Physics, vol. 46, No. 3, Mar. 1975, pp. 1080-1083.
Keefer et al., "Power Absorption Laser Sustained Argon Plasmas", AIAA Journal, vol. 24, No. 10, 1986, pp. 1663-1669.
Keefer, "Laser-Sustained Plasmas", 1989, pp. 169-206.
Kennedy et al., "A Review of the Use of High Power Diode Lasers in Surface Hardening, Journal of Materials Processing Technology", vol. 155-156, 2004, pp. 1855-1860.
Keyser et al. "Studies of High-Repetition-Rate Laser Plasma EUV Sources from Droplet Targets", Applied Physics A, vol. 77, 2003, pp. 217-221.

(56) References Cited

OTHER PUBLICATIONS

Kim et al., "Development of an In Situ Raman Spectroscopic System for Surface Oxide Films on Metals and Alloys in High Temperature Water, Nuclear Engineering and Design", vol. 235, 2005, pp. 1029-1040.
Kindel et al., Measurement of Excited States Density and the VUV-Radiation in the Pulsed Xenon Medium Pressure Discharge, Contrib. Plasma Phys., vol. 36, 1996, pp. 711-721.
Kirk et al., "Methods and Systems for Providing Illumination of a Specimen for Inspection" U.S. Appl. No. 60/806,204, filed Jun. 29, 2006, 48 pages.
Kirk et al., "Methods and Systems for Providing Illumination of a Specimen for Inspection", U.S. Appl. No. 60/759,846, filed Jan. 17, 2006, 18 pages.
Kirk et al., "Methods and Systems for Providing Illumination of a Specimen for Inspection", U.S. Appl. No. 60/772,425, filed Feb. 9, 2006, 20 pages.
Klein, "Measurements of Spectral Emission and Absorption of a High Pressure Xenon Arc in the Stationary and the Flashed Modes", 1968, pp. 677-685.
Klocke et al., "Investigation into the Use of High Power Diode Lasers for Hardening and Thermal Conduction Welding of Metals", SPIE, vol. 3097, 1997, pp. 592-598.
Knyazev, "Photoresonance Plasma Production by Excimer Lasers as a Technique for Anode-plasma Formation", Nucl. Instr. and Meth. in Phys. Res. A, vol. 415, 1998, pp. 525-532.
Kolb et al., "Low Optical Loss Synthetic Quartz", Mat. Res. Bull. vol. 7, 1972, pp. 397-406.
Kondow et al., "Temperature Dependence of Lasing Wavelength in a GaInNAs Laser Diode", IEEE Photonics Technology Letters, vol. 12, No. 7, 2000, pp. 777-779.
Kopecek et al., "Laser Ignition of Methane-Air Mixtures at High Pressures and Diagnostics", Journal of Engineering for Gas Turbines and Power, vol. 127, 2005, pp. 213-219.
Abe et al., "KrF Laser Driven Xenon Plasma Light Source of a Small Field Exposure Tool", Proc. of SPIE, vol. 6151, 2006, pp. 61513T-1-61513T-5.
Agrawal et al., "Infrared And Visible Semiconductor Lasers", 1993, pp. xili-616.
Agrawal et al., "Semiconductor Lasers", Second edition, 1993, p. 547.
Ahmed et al., "Laser Optogalvanic Spectroscopic Studies of Xenon", J. Phys. B: At. Mol. Opt. Phys. 31, 1998, pp. 4017-4028.
Aitoumeziane et al., "Theoretical and Numerical Study of the Interaction of a Nanosecond Laser Pulse with a Copper Target for Laser-Induced Breakdown Spectroscopy Applications", J. Opt. Soc. Am. B, vol. 31, No. 1, 2014, pp. 53-61.
Al-Muhanna et al., High-Power (>10 W) Continuous-Wave Operation from 100-um-Aperture 0.97-um-emitting Al-Free Diode Lasers, Applied Physics Letters, vol. 73, No. 9, Aug. 31, 1998, pp. 1182-1184.
Angel, "LIBS Using Dual-Laser Pulses", 2002, p. 14.
Apter, "High-power Diode Lasers Offer Efficient Answer, Product Guide", 2005, pp. 1-3.
Aragon et al., "Determination of Carbon Content in Molten Steel Using Laser-Induced Breakdown Spectroscopy", 1993, pp. 306-608.
Arieli, Excitation of Gas Laser by Optical Pumping, Chapter 6.1, Gas Laser, 2006, p. 2b.
Arp et al., "Argon Mini-Arc Meets its Match: Use of a Laser-Driven Plasma Source in Ultraviolet-Detector Calibrations", Applied Optics vol. 53, Issue 6 , 2014, pp. 1089-1093.
Arp et al., "Feasibility of Generating a Useful Laser-Induced Breakdown Spectroscopy Plasma on Rocks at High Pressure: reliminary Study for a Venus Mission", Spectrochimica Acta Part B 59, 2004, pp. 987-999.
Arzuov et al., Self-Maintenance of a Continuous Optical Discharge in Gases Near Solid Targets, Soy. J. Quant. Electron., vol. 5. No. 5, 1975, pp. 523-525.

Azuma et al., Debris from Tape-Target Irradiated with Pulsed YAG Laser, Applied Surface Science, 2002, pp. 224-228.
B 11 3mmaxoe; 011THLIECKHE PA3PFIRb1,110flREPK4BAEMbIE I4311YLIEHMEM J1A3EPOB Efill)KHEI-0 ilk-.I4-EIA11A3OHA Ommixo-xmknyeckasi Kmue-rma B ra3ouoii gmuamme, www.chemphys.edu.ru/pdf/2014-11-29-001.pdf.
B.B. Kostin, I4311YLIEH14EF1J1A3Mbl, HAIPETOC4 KOPOTKI4MI4 11A3EPHb1MI4 14M11YllbCAM14 23(2) 014314KA EfftA3Mbl 118 (1997).
B.T. Apxpinkmu and A. K. Dona HEIII4HEOHAFI 011T14KA I4 11PEOBPA3OBAHHE CBETA B IA3AX 153(3) YalEXI4 IM3I44ECK14X HAYK 423 (1987).
Babucke et al., "On the Energy Balance in the Core of Electrode-Stabilized High-Pressure Mercury Discharges", J. Phys. D: Appl. Phys. vol. 24, 1991, pp. 1316-1321.
Bachmann, "Goals and status of the German national research initiative BRIOLAS (brilliant diode lasers)",Proc. of SPIE vol. 6456, 2007. 645608-1.
Bachmann, "Industrial Applications of High Power Diode Lasers in Materials Processing", Applied Surface Science, 208-209, 2003, pp. 125-136.
Baer, "Plasma Diagnostics With Semiconductor Lasers Using Fluorescence and Absorption Spectroscopy", Stanford University ProQuest Dissertations Publishing, 1993, pp. 1-194.
Ball, "Raman Spectroscopy", vol. 17, No. 2, 2002, pp. 50-52.
Ballman et al., "Synthetic Quartz with High Ultraviolet Transmission", Applied Optics, vol. 7, No. 7, 1968, pp. 1387-1390.
Barnes et al., "Argon Arc Lamps", Applied Optics, vol. 24, No. 13, 1985, pp. 1947-1949.
Barnes et al., "High Power Diode Laser Cladding", Journal of Materials Processing Technology, vol. 138, 2003, pp. 411-416.
Bartz et al., "Optical Reflectivity Measurements Using a Laser Plasma Light Source", Appl. Phys. Lett. vol. 55, No. 19, 1989, pp. 1955-1957.
Bataller et al., "Nanosecond High-Power Dense Microplasma Switch for Visible Light", Applied Physics Letters, vol. 105, 2014, pp. 1-5.
Bauder, Radiation from High-Pressure Plasmas, Journal of Applied Physics, vol. 39, No. 1, 1968, pp. 148-152.
Beam Samplers; UV Fused Silica Beam Samplers, (AR Coating: 250-420 nm) (AR Coating: 350-700 nm) (AR Coating: 550-1050 nm) (AR Coating: 1050-1700 nm), 3 pages.
Beck, "Simple Pulse Generator for Pulsing Xenon Arcs with High Repetition Rate," Rev. Sci. Instrum., vol. 45, No. 2, Feb. 1974, pp. 318-319.
Belasri et al., "Electrical Approach of Homogenous High Pressure NelXe/CHI Dielectric Barrier Discharge for XeCl (308 nm) Lamp", Plasma Chem Plasma Process, vol. 31, 2011, pp. 787-798.
Bloch et al., "Field Test of a Novel Microlaser-Based Probe for in Situ Fluorescence Sensing of Soil Contamination", Applied Spectroscopy, vol. 52, No. 10, 1998, pp. 1299-1304.
Bogaerts et al., "Gas Discharge Plasmas and their Applications", Spectrochimica Acta Part B 57, 2001, pp. 609-658.
Bolshov et al., "Investigation of the Dynamic of an Expanding Laser Plume by a Shadowgraphic Technique", Spectrochimica Acta Part B 63, 2008, pp. 324-331.
Borghese et al., "Time-Resolved Spectral and Spatial Description of Laser-Induced Breakdown in Air as a Pulsed, Bright, and Broadband Ultraviolet-Visible Light Source", Applied Optics, vol. 37, No. 18, Jun. 20, 1998, pp. 3977-3983.
Brauch et al., "High-Power Diode Lasers for Direct Applications", Topics Appl. Phys., vol. 78, 1000, pp. 303-368.
Breton et al., "Vacuum-UV Radiation of Laser-Produced Plasmas", Journal of the Optical Society of America, vol. 63, No. 10, 1973, pp. 1225-1232.
Bridges et al., "Investigation of a Laser-Produced Plasma VUV Light Source", Applied Optics, vol. 25, No. 13, Jul. 1, 1986, pp. 2208-2214.
Bridges, "Characteristics of an Opto-Galvanic Effect in Cesium and Other Gas Discharge Plasmas", J. Opt. Soc. Am., vol. 68, No. 3, Mar. 1978, pp. 352-360.
Bussiahn, R., et al., "Experimental and theoretical investigations of a low-pressure He—Xe discharge for lighting purpose," Journal of Applied Physics, vol. 95, No. 9, May 1, 2004, pp. 4627-4634.

(56) References Cited

OTHER PUBLICATIONS

Byer, "Laser-Produced Plasmas: A Compact Soft X-Ray Source with High Peak Brightness", Defence Technical Information Centre, 1989, pp. 1-26.
C10T/C6 Lightshield System Parts Listing, Heraeus Noblelight America LLC, 2015, pp. 1-8.
Cann, "Light Sources in the 0.15-20-μ Spectral Range", Applied Optics, vol. 8, No. 8, 1969, pp. 1645-1661.
Carlhoff et al., "Continuous Optical Discharges at Very High Pressure," Physica 103C, 1981, pp. 439-447.
Carlhoff et al., "High Pressure Optical Discharges", Journal of Physics, 1979, pp. 757-758.
Cedolin et al., "Laser-Induced Fluorescence Measurements of Resonance Broadening in Xenon", Physical Review A. vol. 54, No. 1, 2006, pp. 335-342.
Cedolin, "Laser-Induced Fluorescence Diagnostics of Xenon Plasmas", 1997, pp. 1-96.
Cermax lamps, including models LX300F, LX1000CF, EX300-10F, EX500-13F, EX900C-10F, EX900C-13F,EX1000C-13F, LX125F, LX175F, LX500CF, EX125-10F, EX175-10F, EX500-10F,EX1000C-10F, EX900-10F;Perkin Elmer Optoelectronics.
Cesar et al., "High-power fibre lasers", Nature Photonics, vol. 7, 2013, pp. 861-867.
Chang et al., "Fiber Laser Driven EUV Generation", Conference on Lasers and Electro-Optics, 2005, pp. 2200-2202.
Mobarhan, "Test and Characterization of Laser Diodes: Determination of Principal Parameters", 1999, pp. 1-7.
Moody, "Maintenance of a Gas Breakdown in Argon Using 10.6-μ cw Radiation", Journal of Applied Physics, vol. 46, No. 6, Jun. 1975, pp. 2475-2482.
Mora, "Theoretical Model of Absorption of Laser Light by a Plasma", Phys. Fluids, vol. 25, No. 6, 1982, pp. 1051-1056.
Mordovanakis et al., "Demonstration of Fiber-laser-produced Plasma Source and Application to Efficient Extreme UV Light Generation", Optics Letter, vol. 31, No. 17, 2006, pp. 2517-2519.
Mosier-Boss et al., "Detection of Lead Derived from Automotive Scrap Residue Using a Direct Push Fiber-Optic Laser-Induced Breakdown Spectroscopy Metal Sensor", Applied Spectroscopy, vol. 59, No. 12, 2005, pp. 1445-1456.
Mosier-Boss et al., "Field Demonstrations of a Direct Push FO-LIBS Metal Sensor", Environ. Sci. Technol., vol. 36, 2002, pp. 3968-3976.
Motomura et al., "Temporal VUV Emission Characteristics Related to Generations and Losses of Metastable Atoms in Xenon Pulsed Barrier Discharge", J. Light & Vis. Env. vol. 30, No. 2, 2006, pp. 81-86.
Moulton, "Tunable Solid-State Lasers", Proceedings of the IEEE, vol. 80, No. 3, 1992, pp. 348-364.
Muller et al., "Theoretical Model for a Continuous Optical Discharge", Physica, 112C, 1982, pp. 259-270.
Nagano et al., "Present Status of Laser-Produced Plasma EUV Light Source", Proc. of SPIE, vol. 7636, 2010, pp. 76363C-1-76363C-9.
Nakar et al., "Radiometric Characterization of Ultrahigh Radiance Xenon Short-Arc Discharge Lamps, Ben-Gurion University", Applied Optice, vol. 47, No. 2, Jan. 9, 2008.
Neukum, "Vom Halbleiterchip zum Laserwerkzeug", 2007, pp. 18-20.
Nikitin et al., "Guiding of Intense Femtosecond Pulses in Preformed Plasma Channels", Optics Letter, vol. 22, No. 23, 1997, pp. 1787-1789.
Norimatsu et al., "Cryostat to Provide a Solid Deuterium Layer in a Plastic Shell for the Gekko XII Glass Laser System", Review of Scientific Instruments, vol. 63, No. 6, 1992, pp. 3378-3383.
Zimakov, "Continuous Optical Discharges Sustained by Near-IR Laser Radiation", 42th international conference on plasma physics and CF, 2015, p. 1.
OEM Compact Fiber Laser module 1090nm 10-20W Cw/M With GTWave Technology, SPI Lasers LLC.
Oettinger et al., Plasma Ionization Enhancement by Laser Line Radiation, AIAA Journal, vol. 8, No. 5, 1970, pp. 880-885.
Zhang et al., "Designing a High Performance TEC Controller", Proceedings of SPIE vol. 4913, 2002, pp. 177-183.
Zajac et al., "10 W cw Nd-Doped Double-clad Fiber Laser Operating at 1.06 μm", Proceedings of SPIE vol. 5036, 2003, pp. 135-138.
Yusim et al., "100 Watt, single-mode, CW, Linearly Polarized All-fiber Format 1.56um Laser with Suppression of Parasitic Lasing Effects",Proceedings of SPIE, vol. 5709, 2005, pp. 69-77.
Yoshizawa et al., "Disk-shaped Vacuum Ultraviolet Light Source Driven by Microwave Discharge for Photoexcited Processes", Appl. Physc. Lett., vol. 559, 1991, pp. 1678-1680.
Yoshino et al., "Absorption Spectrum of Xenon in the Vacuum-Ultraviolet Region",J. Opt. Soc. Am. B/vol. 2, No. 8, 1985, pp. 1268-1274.
Orth et al., "High-Resolution Spectra of Laser Plasma Light Sources in the Normal Incidence XUV Region", Applied Optics, vol. 25, No. 13, 1986, pp. 2215-2217.
OSRAM Opto Semiconductors Announces New Solutions for Laser Applications; New Offerings Provide High Output and Enhanced Reliability, Business Wire, Jun. 28, 2005, pp. 1-3.
Oxford Dictionary of Astronomy, definition of bound-bound transition, 2003, p. 59.
Pankert et al., "EUV Sources for the Alpha-Tools", Proc. of SPIE, vol. 6151, 2006, pp. 1-9.
Pappas et al., "Formation of a Cesium Plasma by Continuous-Wave Resonance Excitation", Applied Spectroscopy, vol. 54, No. 8, 2000, pp. 1245-1249.
Parker, "McGraw-Hill Dictionary of Scientific and Technical Terms",5th Edition, 1994, p. 561.
Patel et al., "The Suitability of Sapphire for Laser Windows",Meas. Sci. Technol., vol. 10, 1999, pp. 146-151.
Pebler et al., "Stabilizing the Radiant Flux of a Xenon Arc Lamp", Applied Optice, vol. 20, No. 23, 1981, pp. 4059-4061.
Perry, "Solar Thermal Propulsion: An Investigation of Solar Radiation Absorption in a Working Fluid", 1984 pp. 1-70.
Petring et al., "High Power Diode Lasers", Technology and Applications, 2007, pp. 285-533.
Phillip, "Optical Properties of Non-Crystalline Si, SiO, SiOx and SiO2", J. Phys. Chem. Solids, vol. 32, 1971, pp. 1935-1945.
Phillip, "Optical Transitions in Crystalline and Fused Quartz", Solid State Communications vol. 4, 1966, pp. 73-75.
Phillips et al.,"Characterization and Stabilization of Fiber-Coupled Laser Diode Arrays", Review of Scientific Instruments, vol. 70, No. 7, 1999, pp. 2905-2909.
Plyler et al., "Precise Measurement of Wavelengths in Infrared Spectra", Journal of Research of the National Bureau of Standards, vol. 55, No. 5, 1955, pp. 279-284.
Polijanczuk et al., "Semiconductor Lasers for Microsoldering", 1991, pp. 6/1-6/4.
Prabhu et al., "High-Power CW Raman Fiber Laser Using Phosphosilicate Fiber Pumped by Yb-doped Double-clad Fiber Laser", IEE Colloquium on Advances in Interconnection Technology, 2001, pp. 482-485.
Raizer, "Continuous Optical Discharge: Generation and Support of Dense Low-Temperature Plasma by Laser Irradiation", 1996, pp. 87-94.
Raizer, "Gas Discharge Physics", 1991, pp. 1-449.
Raizer, "Optical Discharges," Sov. Phys. Usp., vol. 23, No. 11, 1980, pp. 789-806.
Rhemet, "Xenon Lamps", IEE Proc., vol. 127, Pt. A, No. 3, 1980, pp. 190-195.
Richardson et al., "High Conversion Efficiency Mass-Limited Sn-Based Laser Plasma Source for Extreme Ultraviolet Lithography", J. Vac. Sci. Technol. B., vol. 22, No. 2, 2004, pp. 785-790.
Rietdorf et al., "Special Optical Elements", J. (eds) Handbook of Biological Confocal Microscopy, 2006, pp. 43-58.
Rockstroh et al., "Spectroscopic Studies of Plasma During CW Laser Materials Interaction", J. Appl. Phys., vol. 61, No. 3, 1987, pp. 917-922.
Roth et al., "Directly Diode-laser-pumped Ti:sapphire laser", Optics Letters, vol. 34, No. 21, 2009, pp. 3334-3336.
Sacchi, "Laser-Induced Electric Breakdown in Water", J. Opt. Soc. Am. B, vol. 28, No. 2, 1991, pp. 337-345.

(56) References Cited

OTHER PUBLICATIONS

Sakamoto et al., "120W CW Output Power from Monolithic AlGaAs (800nm) Laser Diode Array Mounted on Diamond Fleatsink", Electronic Letter, vol. 28, No. 2, 1992, pp. 197-199.
Saloman, "Energy Levels and Observed Spectral Lines of Xenon, Xe(I) through Xe(LIV)", J. Phys. Chem. Ref. Data, vol. 33, No. 3, 2004, pp. 765-921.
Saraswat et al., "Single Wafer Rapid Thermal Multiprocessing", Mat. Res. Soc. Symp. Proc. vol. 146, 1989, pp. 3-13.
Kopecek et al., "Laser-Induced Ignition of Methane-Air Mixtures at Pressures up to 4 MPa", Laser Physics, vol. 13, No. 11, 2003, pp. 1365-1369.
Korn et al., "Ultrashort 1-kHz Laser Plasma Hard X-ray Source", Optics Letters, vol. 27, No. 10, 2002, pp. 866-868.
Kozlov et al., "Radiative Losses by Argon Plasma and the Emissive Model of a Continuous Optical Discharge", Soy. Phys. JETP, vol. 39, No. 3, Sep. 1974, pp. 463-468.
Kozlov et al., "Sustained Optical Discharges in Molecular Gases," Sov. Phys. Tech. Phys. vol. 49, No. 11, Nov. 1979, pp. 1283-1287.
Kranzusch et al., "Spatial Characterization of Extreme Ultraviolet Plasmas Generated by Laser Excitation of Xenon Gas Targets", Review of Scientific Instruments, vol. 74, No. 2, 2003, pp. 969-974.
Krushelnick et al., "Plasma Channel Formation and Guiding during High Intensity Short Pulse Laser Plasma Experiments", Physical Review Letters, vol. 78, No. 21, 1997, pp. 4047-4050.
Ku et al., "Decay of Krypton 1(s)(2) and 1(s)(3) Excited Species in the Late Afterglow", Physical Review A, vol. 8, No. 6, 1973, pp. 3123-3130.
Kubiak et al., "Scale-up of a Cluster Jet Laser Plasma Source for Extreme Ultraviolet Lithography", SPIE, vol. 3676, 1999, pp. 669-678.
Kuhn, "Laser Engineering", 1998, pp. 303-343, 365-377, 384-440.
Kurkov et al., "CW Medium-Power Fiber Lasers for Near IR Range", Proceedings of SPIE, vol. 5449, 2004, pp. 62-69.
Lackner et al., "The Optical Spark Plug: Window-related Issues", Institute of Chemical Engineering, Vienna University of Technology, 2005, pp. 1-6.
Lange et al., "Tunable Diode Laser Absorption Spectroscopy for Plasmas at Elevated Pressures", Proceedings of SPIE Vo. 4460, 2002, pp. 177-187.
Laufer et al., "Effect of Temperature on the Vacuum Ultraviolet Transmittance of Lithium Fluoride, Calcium Fluoride, Barium Fluoride, and Sapphire", Journal of the Optical Society of America, vol. 55, No. 1, 1965, pp. 64-66.
Laufer, "Introduction to Optics and Lasers in Engineering", 1996, pp. 449-454.
Legall et al., "Spatial and Spectral Characterization of a Laser Produced Plasma Source for Extreme Ultraviolet Metrology", Review of Scientific Instruments, vol. 75, No. 11, 2004, pp. 4981-4988.
Lenses and Curved Mirrors, University of Delaware, Imaging (last visited Dec. 19, 2015), pp. 24-29.
Leonov et al., "Mechanisms of Resonant Laser Ionization", JETP, vol. 8, No. 4, 1997, pp. 703-715.
Lewis et al., "Measurements of CW Photoionization for the Use in Stable High Pressure Tea Laser Discharge", IEEE Nuclear and Plasma Sciences Society, 1975, pp. 14-45.
Li et al., "Density measurements of a high-density pulsed gas jet for laser-plasma interaction studies", Meas. Sci. Technol., vol. 5, 1994, pp. 1197-1201.
Li, "The Advances and Characteristics of High-Power Diode Laser Materials Processing", Optics and Lasers in Engineering, vol. 34, 2000, pp. 231-253.
Liao et al., "An efficient Ni Kα X-ray Source Driven by a High Energy Fiber CPA System", Center for Ultrafast Optical Science, 2007, pp. CP1-4-THU.
Liao et al., "Generation of Hard X-rays Using an Ultrafast Fiber Laser System", Optics Express, vol. 15, No. 21, 2007, pp. 13942-13948.
Light Hammer, 10 Mark II UV Lamp System, Heraeus Noblelight America LLC, 2015, pp. 1-20.
Light Hammer, 6 UV Lamp System Parts Listing, Heraeus Noblelight America LLC, 2015, pp. 1-22.
Lo et al., "Resonance-Enhanced LIBS", Department of Physics, 2002, pp. 15-17.
Lowe et al., "Developments in Light Sources and Detectors for Atomic Absorption Spectroscopy", Spectrochimica Acta Part B., vol. 54, 1999, pp. 2031-2039.
Lui et al., "Resonance-Enhanced Laser-Induced Plasma Spectroscopy: Time-Resolved Studies and Ambient Gas Effects", Department of Physics, 2002, pp. 19-21.
Luo et al., "Sapphire (0 0 0 1) Surface Modifications Induced by Long-Pulse 1054 nm Laser Irradiation", Applied Surface Science, vol. 253, 2007, pp. 9457-9466.
MacDowell et al., "Reduction imaging with soft x rays for projection lithography", Review of Scientific Instruments, vol. 63, No. 1, 1992, pp. 737-740.
Maclean et al., "Direct Diode Laser Pumping of a Ti:Sapphire Laser", Institute of Photonics, SUPA, 2009, pp. 1-3.
Magner et al., "Self-Compression of Ultrashort Pulses through Ionization-Induced Spatiotemporal Reshaping", Physical Review Letter, vol. 93, No. 17, 2004, pp. 173902-1-173902-4.
Mahmoud et al., "Ion Formation in Laser-Irradiated Cesium Vapor", Journal of Quantitative Spectroscopy & Radiative Transfer, vol. 102, 2006, pp. 241-250.
Malik et al., "Spectroscopic Measurements on Xenon Plasma in a Hollow Cathode", 2000, J. Phys. D: Appl. Phys., vol. 33, pp. 2037-2048.
Malka et al., "Channel Formation in Long Laser Pulse Interaction with a Helium Gas Jet", Physical Review Letters, vol. 79, No. 16, 1997, pp. 2979-2982.
Mandel'shtam et al., "Investigation of the Spark Discharge Produced in Air by Focusing Laser Radiation II", Soviet Physics JETP, vol. 22, No. 1, 1966, pp. 91-96.
May, "Infrared Optogalvanic Effects in Xenon", Optics Communications, vol. 64, No. 1, 1987, pp. 36-40.
Mazumder et al., "Spectroscopic Studies of Plasma During CW Laser Gas Heating in Flowing Argon", J. Appl. Phys., vol. 62, No. 12, 1987, pp. 4712-4718.
Measures et al., "Fast and Efficient Plasma Heating Through Superelastic Laser Energy Conversion", J. Appl. Phys., vol. 51, No. 7, 1980, pp. 3622-3628.
Measures et al., "Laser interaction based on resonance saturation (LIBORS): an alternative to inverse bremsstrahlung for coupling laser energy into a plasma", 1979, Applied Optics, vol. 18, No. 11, pp. 1824-1827.
Measures et al., "TABLASER: Trace (Element) Analyzer Based on Laser Ablation and Selectively Excited Radiation", Applied Optics, vol. 18, No. 3, 1979, pp. 281-286 (1979).
Measures, "Electron Density and Temperature Elevation of a Potassium Seeded Plasma by Laser Resonance Pumping",J. Quant. Spectrose. Radial. Transfer. vol. 10, 1970, pp. 107-125.
Mercury Vapor Light Source, Model OS-9286A.
Michel et al., "Analysis of Laser-Induced Breakdown Spectroscopy Spectra: The Case for Extreme Value Statistics", Spectrochimica Acta Part B, vol. 62, 2007, pp. 1370-1378.
Michel et al., "Laser-Induced Breakdown Spectroscopy of Bulk Aqueous Solutions at Oceanic Pressures: Evaluation of Key Measurement Parameters", Applied Optics, vol. 46, No. 13, 2007, pp. 2507-2515.
Milian et al., "Dynamic Compensation of Chromatic Aberration in a Programmable Diffractive Lens", Optical Express, vol. 14, No. 20, 2006, pp. 9103-9112.
Millard et al., "Diode Laser Absorption Measurements of Metastable Helium in Glow Discharges", Plasma Sources Sci. Technol., vol. 7, 1998, pp. 288-394.
Mills et al., "Argon-Hydrogen-Strontium Discharge Light Source", IEEE Transactions on Plasma Science, vol. 30, No. 2, 2002, pp. 639-652.
Mills et al., "Excessively Bright Hydrogen-Strontium Discharge Light Source Due to Energy Resonance of Strontium with Hydrogen", J. Plasma Physics, vol. 69, Part 2, 2003, pp. 131-158.
Mizoguchi et al., "Development of Light Source for Lithography at Present and for the Future", vol. 59, No. 166, 2013, pp. 1-7.

(56) References Cited

OTHER PUBLICATIONS

Mizoguchi et al., Development of CO2 Laser Produced Xe Plasma EUV Light Source for Microlithography, Proc. of SPIE, vol. 6151, 2006, pp. 61510S-1.

International Search Report and Written Opinion received for PCT Application No. PCT/US2023/061200, mailed on May 25, 2023, 8 pages.

ALL-OPTICAL LASER-DRIVEN LIGHT SOURCE WITH ELECTRODELESS IGNITION

The section headings used herein are for organizational purposes only and should not be construed as limiting the subject matter described in the present application in any way.

INTRODUCTION

Numerous commercial and academic applications have need for high brightness light over a broad wavelength range. For example, laser-driven light sources are available that provide high brightness over spectral ranges from the extreme UV through visible and into the infrared regions of the spectrum with high reliability and long lifetimes. Various examples of such high-brightness light sources are produced by Energetiq, a Hamamatsu Company, located in Wilmington, MA.

There is growing demand for high-brightness light sources for applications including, for example, semiconductor metrology, sensor calibration and testing, creating shaped light, surface metrology, spectroscopy and other optical measurement applications in diverse fields including biology, chemistry, climate, and physics. As such, advances are needed in high-brightness light sources that can improve, for example, size, cost, complexity, reliability, stability and efficiency of these important types of broadband light sources.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The skilled person in the art will understand that the drawings, described below, are for illustration purposes only. The drawings are not necessarily to scale; emphasis instead generally being placed upon illustrating principles of the teaching. The drawings are not intended to limit the scope of the Applicant's teaching in any way.

DESCRIPTION OF VARIOUS EMBODIMENTS

Figure 1:
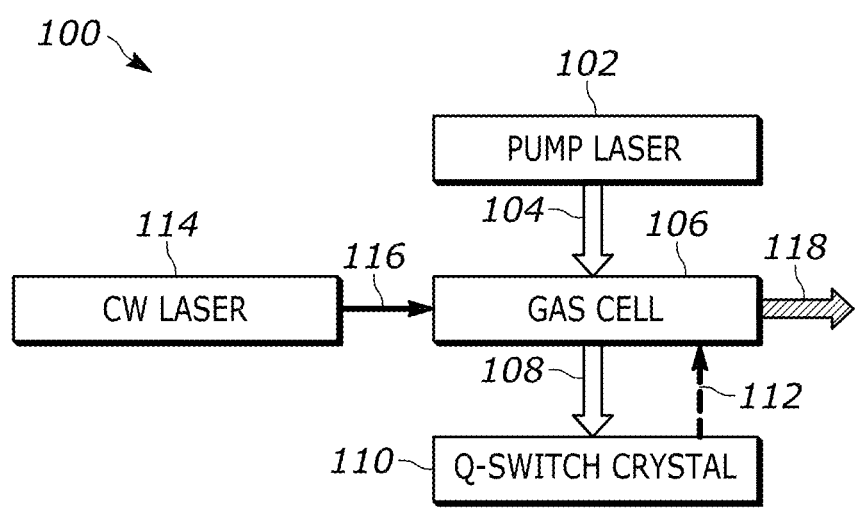
FIG. 1 illustrates a schematic of an embodiment of a laser-driven light source comprising electrodeless ignition according to the present teaching.

The present teaching will now be described in more detail with reference to exemplary embodiments thereof as shown in the accompanying drawings. While the present teaching is described in conjunction with various embodiments and examples, it is not intended that the present teaching be limited to such embodiments. On the contrary, the present teaching encompasses various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the method of the present teaching can be performed in any order and/or simultaneously as long as the teaching remains operable. Furthermore, it should be understood that the apparatus and method of the present teaching can include any number or all of the described embodiments as long as the teaching remains operable.

Laser driven light sources use a CW laser to directly heat a gas plasma to the high temperature needed to produce broadband optical light. High-brightness laser driven light sources have a significant advantage compared to light sources that use high-voltage electrodes to sustain a plasma. Laser driven sources depend on optical-discharge plasma as opposed to electric discharge plasma used in, for example, arc-lamp devices. In electric discharge lamps, electrode materials can evaporate, and change the properties of the discharge over the life of the lamp. This reduces lamp lifetime. Also, electrode-based systems lead to thermal, mechanical and electrical stress of the light source. Known laser driven light sources do not rely on electrodes to sustain the plasma, however they still utilize electrodes for plasma ignition.

Known light sources that rely on electrodes can have serious limitations. For example, electrode-based light sources can have limits on the lamp head size and restrictions on how bulb can be mounted. Electrode-based light sources must be designed to avoid parasitic arcs, and the lamp head needs be configured with sufficient volume for electrodes and for ignition circuit. Electrode-based light sources have limitations on the cold fill pressure of the bulb because, for example, the glass-to-metal seal of electrodes can limit the maximum fill pressure. Also, the size of the bulb can be larger in electrode-based light sources, which can affect bulb fill pressure. Electrode-based light sources also have limited bulb shapes that can be accommodated. This is because, for example, electrode-based light sources require positioning, securing, and connecting electrodes. These design constraints can result in producing noise in the light source.

Thus, providing a laser driven light source with electrodeless ignition can lead to improved reliability, performance, reduced cost and complexity in addition to other benefits. Igniting a plasma with optical illumination requires careful design and control of the light source and associated light delivery mechanisms used to ignite the plasma. One feature of the present teaching is providing a laser-driven light source with electrodeless ignition. In these sources, the plasma is ignited by optical illumination, and not by electrical energy provided by an electrode as in known laser driven high-brightness light sources.

There are numerous features and benefits of electrodeless laser driven light sources. Electrodeless light sources can be implemented using a smaller bulb with higher maximum fill pressures than prior art light sources. A higher fill pressure can result in higher brightness, especially in certain laser power regimes. Electrodeless light sources have no contamination from electrode material. In addition, there are fewer lamp shape geometry limitations. Generally smaller lamp heads can be used for the same characteristics. Also, there are no high-voltage active electrical components to power, thereby reducing the need for an associated power supplies, control electronics and electrical connection, which significantly reduces the number of required components. However, some embodiments of electrodeless laser drive light source can be implemented in the existing lamp package of laser-driven light sources that do have electrode ignition. This is at least, in part, because the electrodeless device is generally less complex and smaller than electrode-based laser driven light sources. For example, an electrodeless laser-driven light sources is described in U.S. patent application Ser. No. 17/328,433, entitled "Laser-Driven Light Source with Electrodeless Ignition", which is assigned to the present assignee and which is also incorporated herein by reference.

One feature of the present teaching is that it can provide an electrodeless laser-driven light source without the need to electronically control a separate igniting optical pulse. Rather, the optical ignition pulses are generated all-optically within the source components. Such an approach has several advantages over electrodeless laser-driven light source where the pulse source is controlled electrically. For example, an even smaller bulb can be used. Also, the number of electronic connections to the source package can be reduced. Also, no specialized power supplies or laser drive electronics are needed to form an electronically-driven and controlled pulse source.

FIG. 1 illustrates a schematic of an embodiment of a laser-driven light source 100 comprising electrodeless ignition according to the present teaching. A pump laser 102 supplies optical pump light 104 to a gas cell 106. The pump light passes through the cell and emerges as through pump light 108 that is provided to a Q-switch crystal 110. The through pump light 108 emerging from the gas cell 106 has the appropriate energy to cause the Q-switch crystal 110 to generate optical pulsed light 112 that is provided back to the gas cell 106. Energy from the optical pulse light 112 is provided to a plasma breakdown region in the gas cell 106 and ignites the plasma. In some embodiments, the gas cell 106 is a gas-filled bulb. In some embodiments, the gas cell 106 is a gas chamber that includes at least one window that passes the wavelengths of the pump light 104, the optical pulsed light 112, CW light 114 and high-brightness CW plasma light 118.

A CW laser 114 generates the CW laser light 116. The CW laser light 116 is provided to the gas cell 108 as a sustaining light to the plasma breakdown region in the gas cell 108. The region illuminated by the pulse laser light 112 in the gas cell 106 may be referred to as a pulse illumination region, and has a well-defined position and shape based on the optical projection elements (not shown) that are used to direct the pulse light 112 from the Q-switch crystal 110 and the CW laser light 116 to the cell 106. These projection elements include various focusing and/or directing elements in various different embodiments. Energy from the optical pulsed light 112 provided to the plasma breakdown region in the cell 106 ignites the plasma. The region illuminated by the CW sustaining light may be referred to as a CW sustaining illumination region, and has a well-defined position and shape based on the projection elements not shown used to direct the optical light from the CW laser 114. These projection elements include various focusing and/or directing elements in various different embodiments. Energy from the CW laser light 114 provided to the plasma breakdown region sustains the plasma. The plasma breakdown region produces high-brightness CW plasma light 118.

The optical pulsed light 112 has the high-peak-power needed to ignite a plasma in the gas cell 106. However, to generate sustained CW plasma light 118, the optical pulsed light 112 must not exceed a certain energy/power threshold, which can occur if optical pulses are present in the plasma after a predetermined delay after the plasma light 118 reaches a predetermined threshold. Too much optical pulse light 112 energy delivered to the gas cell 106 can extinguish the plasma. To prevent the optical pulse light 112 from extinguishing the plasma, a mechanism is needed to extinguish the pulsed light 112 after the generation of sustained CW plasma light. This can be implemented in the all-optical laser driven light source 100 by exploiting pump laser light reduction in the gas cell 106 that occurs when the plasma ignites. When the plasma ignites, the pump light that passes through the cell and emerges as through pump light 108 that is provided to a Q-switch crystal 110 is much reduced in power compared to the pump light 104 that emerges from the pump laser 102. Also, the pump light that passes through the cell 106 and emerges as through pump light 108 when the plasma is ignited is much reduced in power compared to the pump light that passes through the cell 106 and emerges as through pump light 108 when the plasma is not ignited. This extinguished through pump light 108 in turn extinguishes the pulse laser light 112. By extinguishing the pulsed light 112 before a subsequent pulse extinguishes the CW plasma, the plasma light can be sustained by application of only the CW sustaining light 116 from the CW laser 114.

Because the pulsed light 112 is stopped when the CW plasma ignites, there is no need for a sensor and/or an electronic shutter and/or other electronic shut off to actively extinguish the pulse light 112 after breakdown. If the plasma extinguishes for some unexpected reason, it will automatically start to try pulse ignition again, since the plasma will not be present to absorb the pump light. In other words, the plasma will self-re-ignite. This leads to a simple, compact, and high reliability electrodeless source. There is no need for active monitoring to control the pulsed light.

One feature of embodiments of the all-optical electrodeless source of the present teaching, is that the position of the pulse illumination region and the CW sustaining illumination region can be adjusted to provide a desired performance of the plasma light. The relative position of the pulse illumination region and the CW sustaining illumination region impacts the threshold of the energy/power beyond which a CW sustaining plasma is exceeded. In some embodiments, the two regions are distinct and do not overlap. In some embodiments, the two regions overlap to a small degree.

Figure 2A:
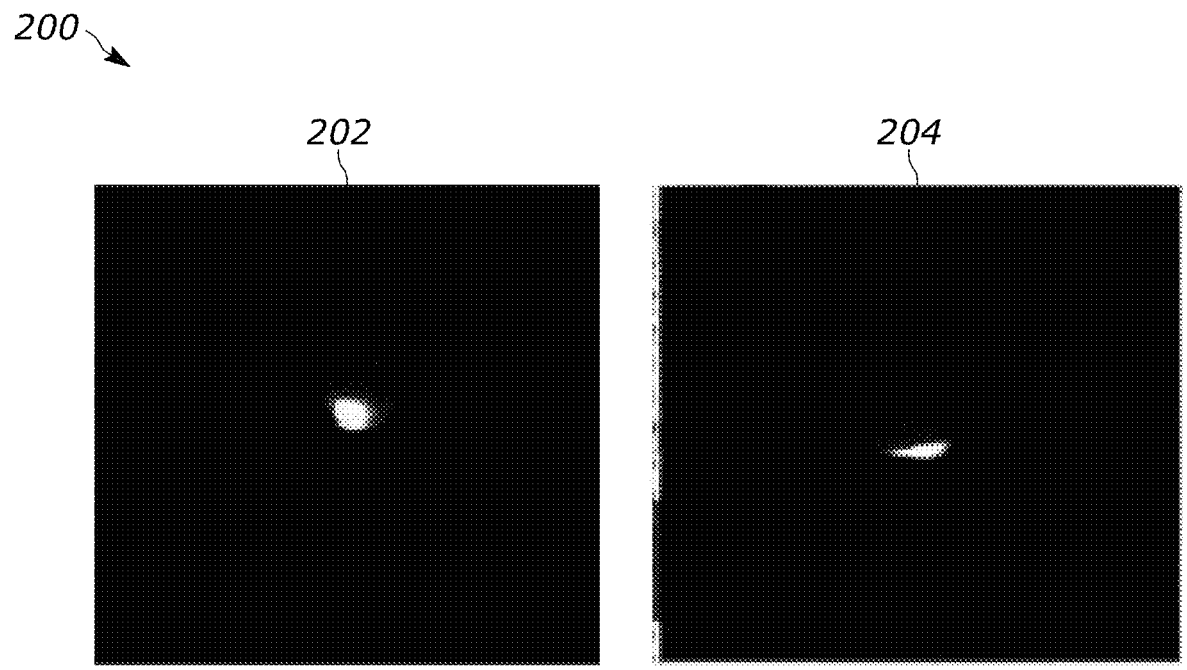
FIG. 2A illustrates an image of a gas-filled bulb of an electrodeless laser-driven light source according to the present teaching that shows the emission with only pulse laser excitation.

FIG. 2A illustrates images 200 of a gas-filled bulb in an embodiment of an electrodeless laser-driven light source according to the present teaching that shows the emission with only pulse laser excitation. Both images 202, 204 are shown from a side-view, but they are offset in angle to illustrate the three-dimensional positioning of the locations of the pulsed illumination region and the focus of the CW laser. The extent and position of the pulsed illumination region is visible in these images 202, 204. Note that the position of pulse breakdown depends on the pulse energy. As the energy increases, breakdown location moves toward pulsed laser. Three-dimensional alignment of the pulse laser breakdown plasma relative to the pulsed light and relative to the focus of the CW laser allows the method to work with lower CW laser power and/or lower pulse energy.

Figure 2B:
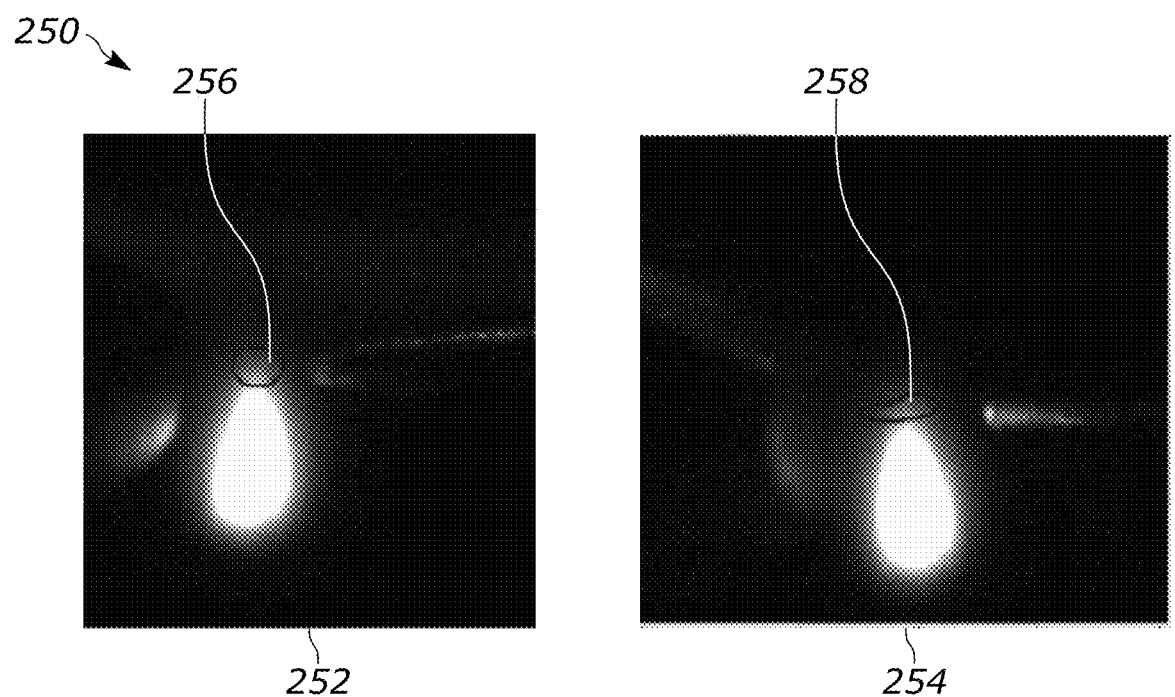
FIG. 2B illustrates an image of a gas-filled bulb of an electrodeless laser-driven light source according to the present teaching that shows the emission with only CW laser excitation.

FIG. 2B illustrates images 250 of the gas-filled bulb shown in FIG. 2A that shows the emission with only CW laser excitation. Both images 252, 254 are shown from a side-view, but they are offset in angle to illustrate the three-dimensional positioning of the locations of the pulsed illumination region and the focus of the CW laser. The extent and position of the pulsed illumination region is visible in these images 252, 254. Outlines 256, 258 of the pulse illumination regions from the images 202, 204 of FIG. 2A are also illustrated. In this embodiment, the relative positions and shapes of the pulsed illumination region and the CW sustaining illumination region are such that the two regions are distinct and do not overlap. The pulse illumination region is smaller as the light is more tightly focused, resulting in a high density of pulsed energy delivered to the plasma by the illumination.

The images of FIGS. 2A-B were collected during experiments to determine operating parameters for pulses that provide plasma ignition. Some details of the experimental conditions are described below. For example, with a 2-kHz pulse rate and 1-ns-duration pulse, stable plasma ignition can be realized in a Xenon gas-filled bulb over a range of energies from 135 to 225 micro Joule. The pulse light had a 1064 nm wavelength. For this particular example of an experimental configuration, the threshold energy to breakdown light to achieve a stable CW plasma was 135 micro Joule. Furthermore, at 210 micro Joules, the plasma ignites and can eventually be stable, but there can be ignition and extinguishing of CW plasma before the stable operation. It is also possible to realize ignition at 225 micro Joules and higher. The relative position of the pulsed light illumination and the CW light illumination is critical. Adjusting the bulb and CW laser alignment along the optical axis of the pulsed laser improves or 'turns off' ignition. In this experiment, after the CW plasma was lit, the CW laser power could be lowered to 8-10 Watts while still sustaining the CW laser power. At any value of CW laser power above 15.5 Watts, there was reliable transition from pulse to CW. There was no upper limit on CW laser power experienced. As understood by those skilled in the art, the beam quality affects the energy delivered to the gas for a given laser power.

Figure 3:
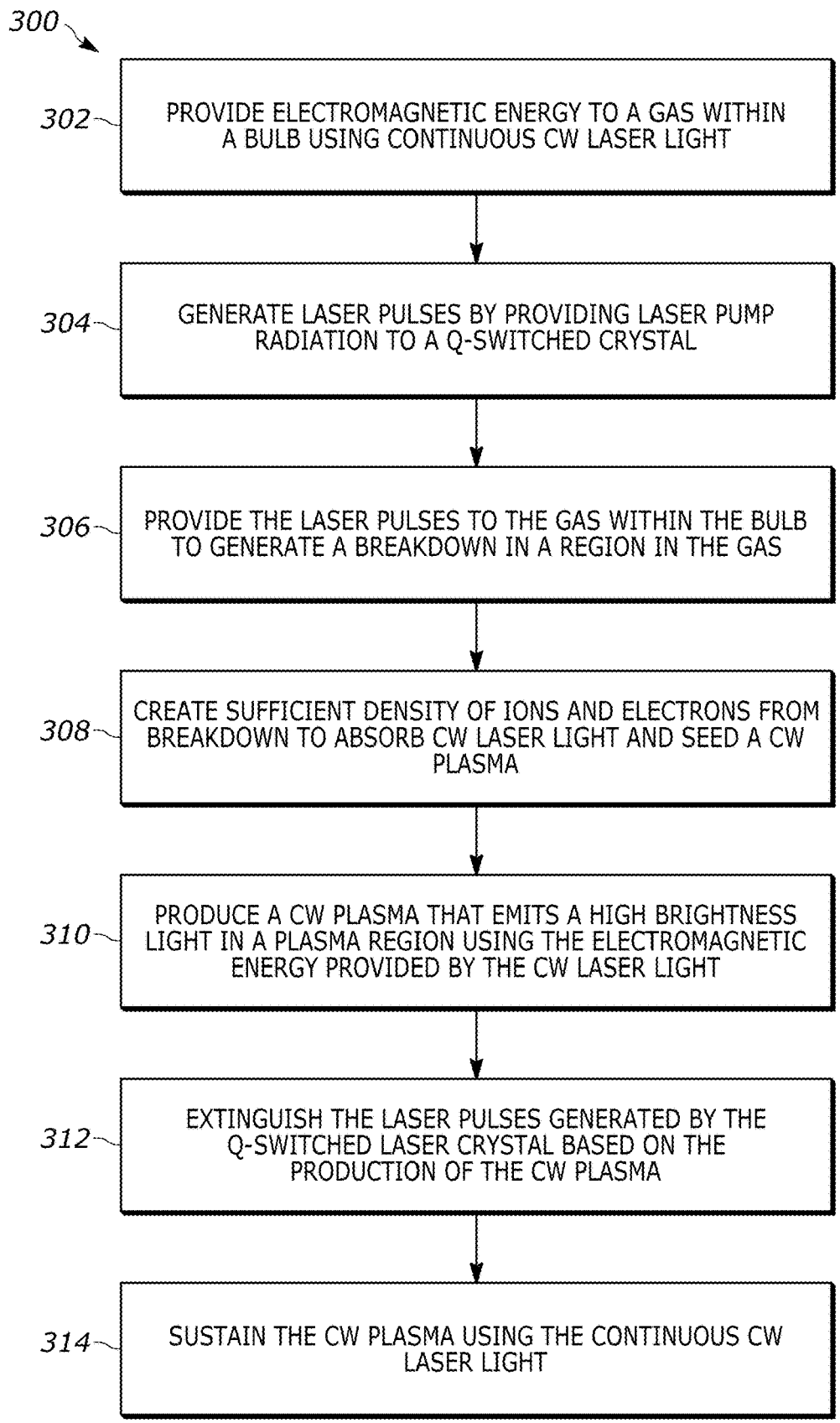
FIG. 3 illustrates steps of a method to ignite a plasma in an electrodeless all-optical laser-driven light source according to the present teaching.

One feature of the all-optical electrodeless laser-driven light source of the present teaching is that the pulse laser light can be extinguished by an absorptive process in the gas cell, rather than relying on external electronic feedback. FIG. 3 illustrates steps of a method to ignite a plasma in an electrodeless all-optical laser-driven light source according to the present teaching. In a first step 302, electromagnetic energy is provided to a gas within a bulb using continuous wave CW laser light (e.g. light 116 from laser 104 into gas cell 106 of FIG. 1). In a second step 304, laser pump radiation is provided to a Q-switched crystal (e.g. light 108 from laser 112 into crystal 116 of FIG. 1). The laser pump radiation causes the Q-switched crystal to generate pulsed light with a particular pulse duration and pulse repetition rate that is dependent upon the power of the laser pump radiation input to the crystal. In a third step 306, the generated pulsed light is provided to a gas (e.g. light 112 provided to cell 106 of FIG. 1). In some embodiments, the gas is contained in a pressurized bulb. In some embodiments, the gas is Xenon gas. The provided pulsed laser light generates a breakdown in a region of the gas, the breakdown region. In a fourth step 308, a sufficient density of ions and electrons in the break-down region are generated to absorb the provided CW laser light to seed a CW plasma. In a fifth step 310, the electromagnetic energy provided by the CW laser light produces a CW plasma that emits a high brightness light in a plasma region. In a sixth step 312, the production of the CW plasma extinguishes the pulsed light generated by the Q-switched crystal. In some embodiments the extinguishing is a result of absorption of the pump light passing through the gas with ignited plasma before impinging on the Q-switched crystal. In a seventh step, after the pulsed laser light is extinguished the high brightness light is sustained by sustaining the plasma in the bulb or other container using the CW laser light. We note that in some embodiments the CW continuous light is nominally a continuous light source that is produced by pulsed laser operation at a high pulse rate. In some configurations, the laser that sustains the CW plasma can also be the same laser that pumps the non-linear crystal.

Various embodiments of the laser-driven high brightness sources with electrodeless ignition of the present teaching use different parameters of the light provided to the gas. For example, the repetition rate of Q-switched laser pulses can be controlled. The pulse energy of the pulse light that is provided to the gas can be controlled. The duration of the Q-switch laser pulses can also be controlled. In addition, the power of the CW laser light is also controlled. In some embodiments, a pulse repetition rate of the pulsed laser light is in a range of 1 kHz to 20 kHz.

Experimental and/or theoretical evaluations have determined that quality CW plasma can be provided, for example, when the Q-switch laser crystal is configured so that a pulse repetition rate of the pulsed laser light is less than or equal to 1 kHz. Continuous wave plasma can be produced when the Q-switched laser crystal is configured so that a pulse energy of the pulsed laser light is in a range of 50 micro Joules to 500 micro Joules.

Continuous wave plasma is produced under a variety of pulse energy, pulse duration, and CW power conditions depending on the particular configuration. For example, continuous wave plasma is produced when the Q-switch laser crystal is configured so that a pulse energy of the pulsed laser light is in a range of 500 micro Joules to 5 millijoules. In addition, continuous wave plasma can be produced when the Q-switch laser crystal is configured so that a pulse duration of the pulsed laser light is in a range of 0.1 ns to 10 ns. Continuous wave plasma can also be produced when the CW laser source is configured so that a power of the CW sustaining light is in a range of 5 W to 50 W. Also, continuous wave plasma can be produced when the CW laser source is configured so that a power of the CW sustaining light is in a range of 5 W to 1500 W. The ranges described above are just examples of operating ranges, and not intended to limit the present teaching in any way.

Figure 4A:
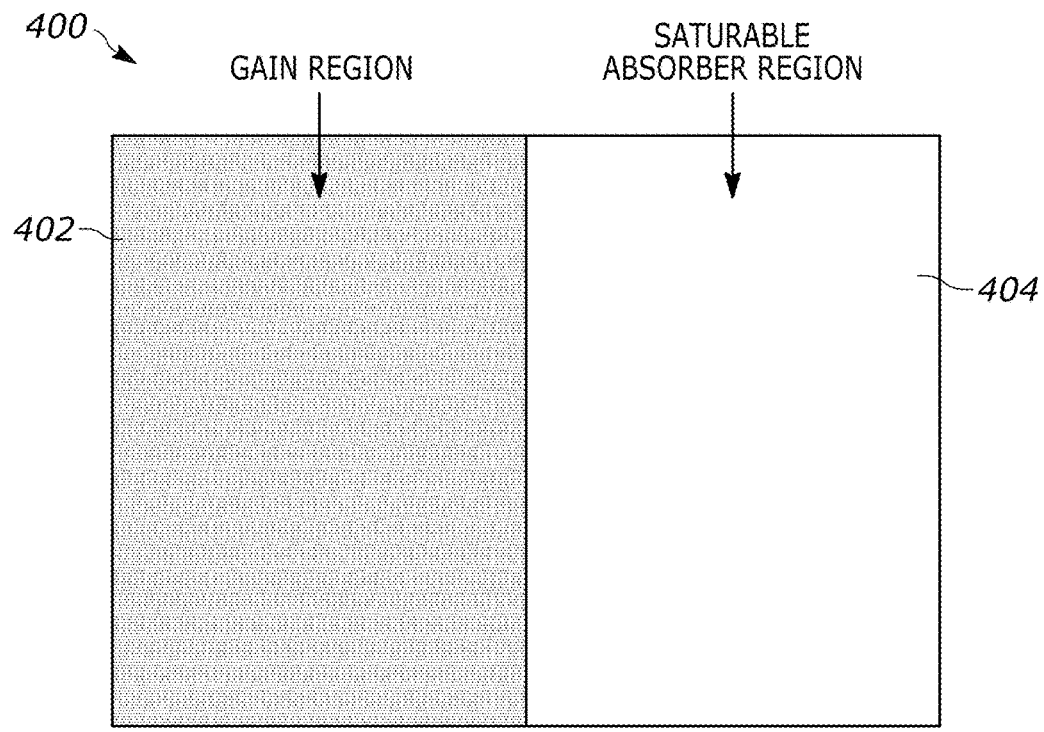
FIG. 4A illustrates an embodiment of a Q-switched crystal of the present teaching that includes a gain region and a saturable gain/loss region.

One feature of the present teaching is that it can use different known Q-switch crystals. The wavelength of the pulsed light should be appropriate to cause a breakdown of the gas specie(s) in the bulb. FIG. 4A illustrates an embodiment of a Q-switched crystal 400 of the present teaching that includes a gain region 402 and a saturable gain/loss region 404. As understood by those skilled in the art, different host materials and dopants can be used to provide a suitable gain region 402 and a saturable absorber region 404. For example, the crystal 400 can have a host material that can be a glass host, an yttrium aluminum garnet host, or a spinel host. For example, the crystal 400 can have a dopant in one or both of the gain region 402 and saturable absorber region 404 that can be an ytterbium dopant, a chromium dopant, a cobalt dopant or a vanadium dopant. The Q-switch crystal can also include a narrow-band filter that can be used, for example, to reflect at least some of the plasma light and/or block wavelengths in the Xenon spectrum. This coating, for example, can be a protective coating, a reflective coating, and/or an anti-reflection coating.

Figure 4B:
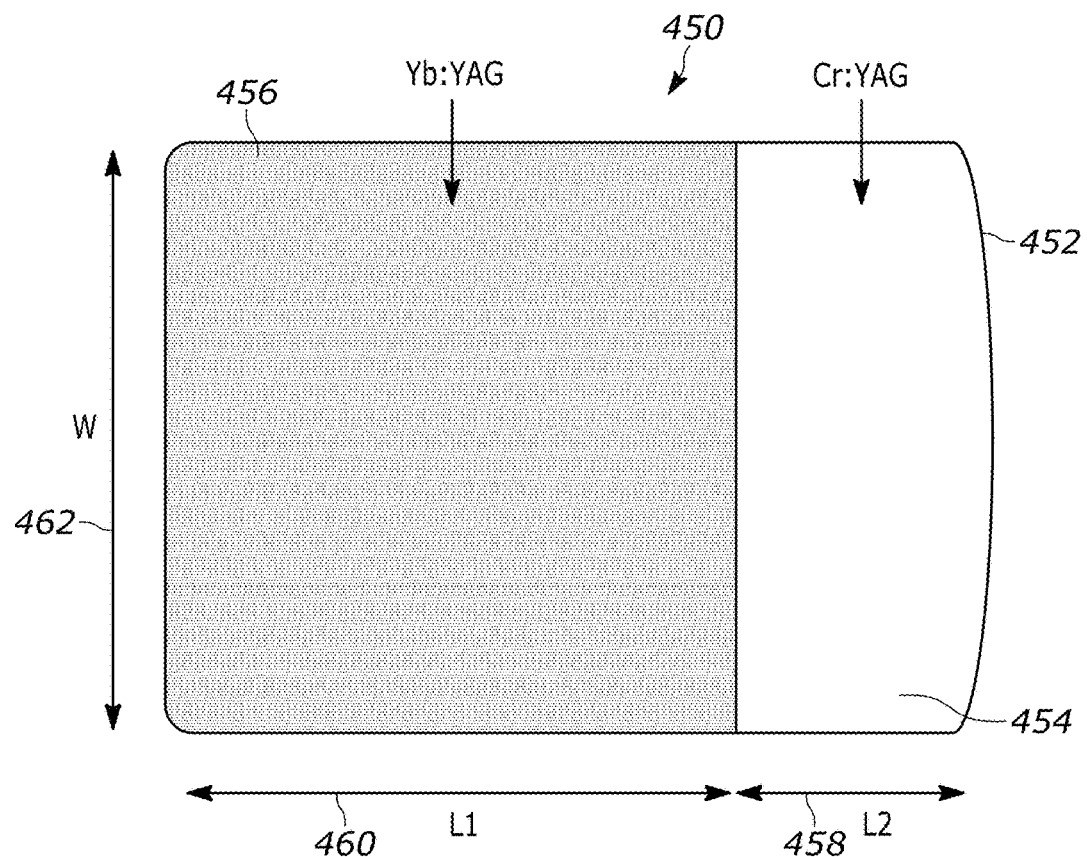
FIG. 4B illustrates a passively Q-switched laser rod suitable for an electrodeless laser-driven light source according to the present teaching.

FIG. 4B illustrates a passively Q-switched laser rod 450 suitable for an electrodeless laser-driven light source according to the present teaching. The yttrium aluminum garnet based (YAG-based) passively Q-switched laser rod 450 has a curved face 452. The saturable absorber region 454 is a chromium dopant in an yttrium aluminum garnet host. The gain region 456 is an ytterbium dopant in an yttrium aluminum garnet host. The dopant and host contribute to setting the wavelength of the pulsed light as well as the rise and fall time of the pulses. A saturable absorber region length 458, L2, a gain region length 460, L1, and a crystal width 462, W, are chosen to provide desired output pulse parameters, including, for example, pulse repetition rate, pulse duration, pulse energy.

Q-switch crystals are a proven technology. For example, Q-switch crystals are used in known passively Q-switched microchip lasers. As one particular example, a microchip laser using a crystal with a saturable absorber region length 458, L2=1.36 mm, a gain region length 460, L1=3 mm, and a crystal width 462, W=3 mm, provided 1.6 ns pulses having 74 microJoules of energy at 14-kH repetition rate and was realized from a 10-W pump power at 970 nm wavelength pump laser. With increasing pump power, the mean output power, and generated pulse repetition rate can be increased to 1 W and 13.6 kHz, respectively, for a pumping power 9.3 W. A maximum output power can be reached without observable thermal roll-over. An average pulse width of 1.58±0.04 ns can also be realized. In practice, a pulse energy and peak power value of 73.8±0.7 µJ, and 46.0±0.8 kW, respectively, was realized. One feature of the present teaching is that electrodeless ignition can be realized with pulsed light parameters that can be realized by these highly available, compact, reliable sources of optical pulses provided by Q-switch crystals 400, 450 that are pumped with optical pump light.

Pumping efficiency and pulse output depend on various properties of the crystal 400, 450 including for the gain crystal 402, 456, the doping element (e.g. YB or Nd), the doping percentage, and the diameter and length. For the saturable absorber crystal 404, 452, the doping element (e.g. Cr or V), the doping percentage, initial absorption percent, diameter and/or length. In some embodiments, reflection and/or transmission coatings for pump wavelength and pulsed light wavelength are provided on one or more ends of the crystal 400, 450. For example, a Yb:YAG-Cr:YAG bonded crystal can include a coating on the Yb:YAG end that is high transmission for 940 nm, and high reflection for 1030 nm. And, on the Cr:YAG end, the crystal can have a coating that is only partially reflective at 1030 nm (i.e. output coupler). While many Q-switched lasers have pump configurations that have the saturable absorber and output coupler on the opposite end from the incoming pump laser, pulsed Q-switch crystals for electrodeless ignition can have the output coupler at the pump input end, rather than the saturable absorber end.

Some embodiments of the crystal 400, 450, can have undoped end sections around the Yb:YAG or Cr:YAG, which can be referred to as a non-absorbing mirror. Such a configuration avoids thermal overload and facet failure. In the gain region 402, 456, a gain medium of Nd:YAG is common and relatively low cost. A Nd:YAG gain region 402, 456 is pumped at 808 nm, and emits light at 1064 nm. A gain region 402, 456 of Yb:YAG is less common and more expensive. This material is pumped at 940 or 970 nm wavelength and emits light at 1030 nm. These Yb:YAG crystals are most commonly coated to accommodate for 940 nm pumping. Crystals coated for 940 nm may not work well at 970 nm (e.g. coating at 940 nm only 60% transmissive at 970 nm). In addition, 940 nm wavelength light is generally easier than 970 nm light to separate from 1030 nm. It is also possible for Yb doped glass to be pumped at 975 nm. This pump wavelength is the same as used in known laser driven light source laser wavelengths.

Some important features in the design of a Q-switch crystal for producing pulsed light for electrodeless ignition according to the present teaching include, for example, choice of laser wavelength, the order of arrangement of coatings, gain section, saturable absorber section, and the direction of the pump pulse input and output. Other important features include the combining/separation of the pump and plasma beams and accommodation of a need to protect the CW laser from the pulses produced by the Q-switch crystal. Referring back to FIG. 1 different embodiments of the light source 100 can have different configurations for the positions of the pump laser 102, Q-switch crystal 116 and CW laser 114 that impact these design choices. In addition, because of the high pulse energies, the mounting of the crystal 116 and associated thermal management are important considerations.

Figure 5:
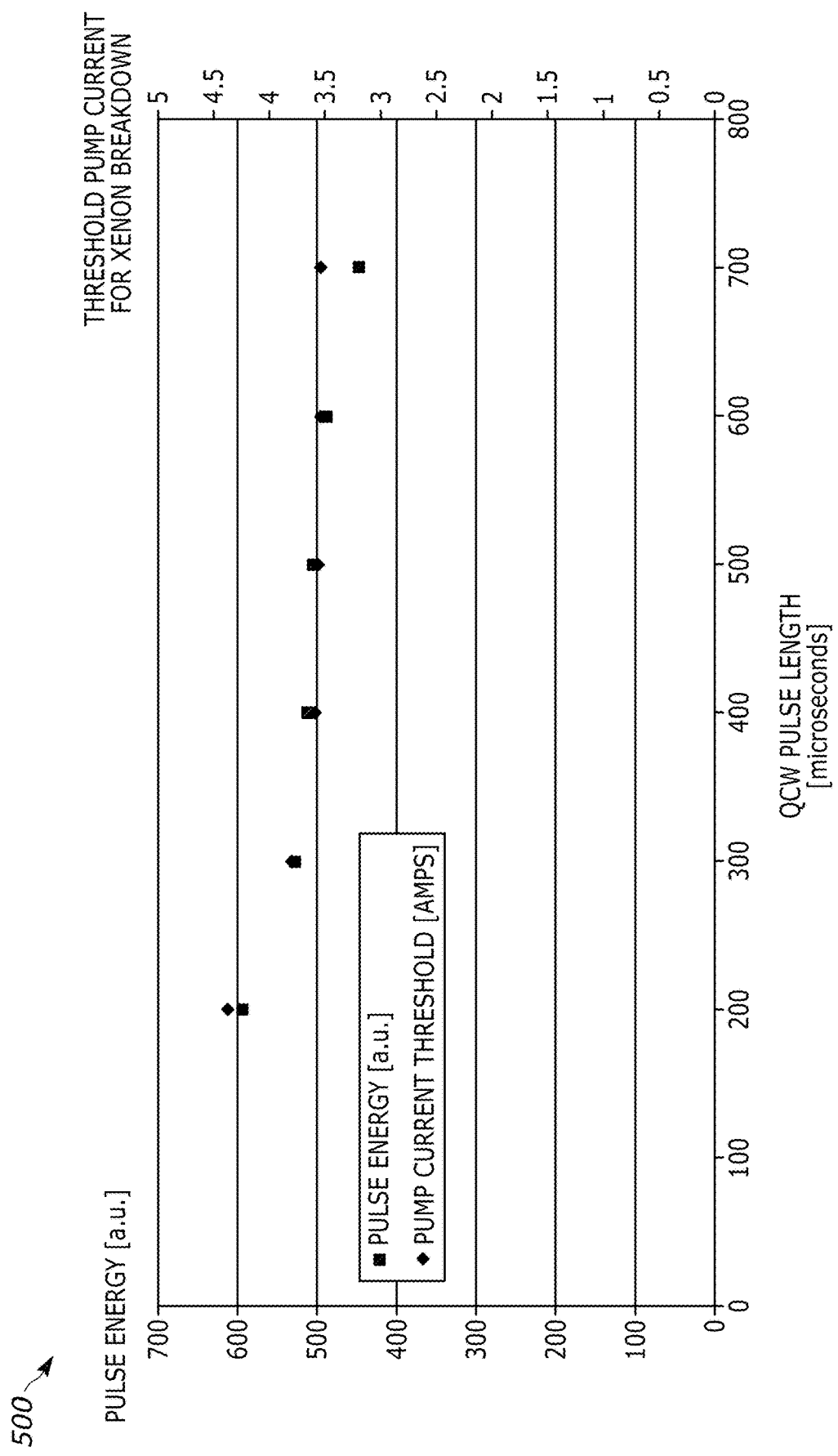
FIG. 5 illustrates a graph of the pulse energy and pump current threshold for a pump laser that creates a laser pulse sufficient to result in gas breakdown as a function of the pulse length of the quasi-CW pump pulse suitable for an electrodeless laser-driven light source according to the present teaching.

FIG. 5 illustrates a graph 500 of the pulse energy and pump current threshold for a pump laser that creates a laser pulse sufficient to result in gas breakdown as a function of the pulse length of the quasi-CW (QCW) pump pulse used in an embodiment of an electrodeless laser-driven light source according to the present teaching. That is, the pulse length is a width of a pulse that is repetitive (e.g. width of pulse in a square wave signal) that is used to generate a quasi-CW pump light signal. The graph 500 represents measurements on a bulb containing xenon gas. The graph 500 illustrates an example operating point, and shows that operation can occur over a range of pulse durations. The threshold levels out above pulse lengths of ~500 microseconds. Note that various embodiments of the light source of the present teaching can operate with parameters that are different from those illustrated in this example data. Some examples of operational parameters of pulsed ignition and transition handoff for a 22 atmosphere pressure cold bulb fill with xenon gas are as follows: (1) a CW transition handoff can be realized with CW laser power as low as 14 W at a 980 nm wavelength; (2) a CW transition handoff can be realized with CW laser light center wavelength as low as 972 nm; (3) a nearly instantaneous CW transition handoff can be realized with CW laser light center wavelength as low as 975 nm; and 4) a CW transition handoff can be realized with CW laser power as high as 50 Watts. When the content of laser spectrum at 980 nm goes to zero, a transition handoff may take from seconds to one or two minutes. When the CW laser power is at 20 Watts, the vary center wavelength is between 1-2 nm away from a 980 nm center wavelength for successful transition handoff. With a 30 atmosphere cold-fill bulb, it is possible to achieve a CW transition handoff at 30 Watts and 976 nm center wavelength from the CW laser. In general, ignition is more robust with a higher pressure bulb than a lower pressure bulb. For examples, a bulb with a pressures over 30 atm would in general have a more robust ignition than a bulb with a pressure of about 22 atm.

Figure 6:
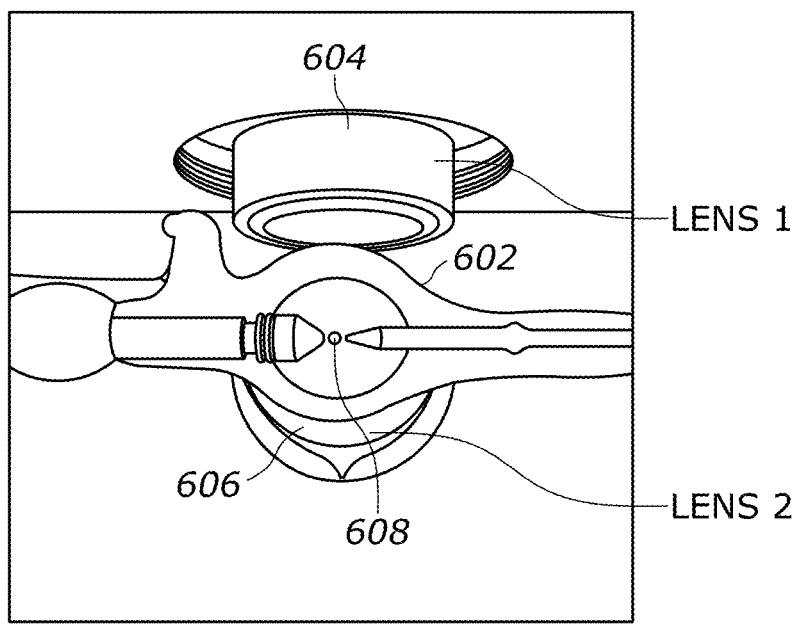
FIG. 6 illustrates a gas-filled bulb system with a focusing lens assembly suitable for use in an electrodeless laser-driven light source according to the present teaching.

FIG. 6 illustrates a gas-filled bulb system 600 with a focusing lens assembly 604, 606 suitable for use in an electrodeless laser-driven light source according to the present teaching. The plasma region 608 is shown. The focusing lens assemblies 604, 606 are configured at planes that are oriented at 90-degrees from one another. One assembly 604 directs the pulse light to the plasma region 608 in the bulb 602, and the other assembly 606 directs the CW sustaining light to the plasma region 608 in the bulb 602. As described herein, the shapes of the pulsed illumination and the CW sustaining illumination in the plasma region 608 can be the same or different. The positions of the pulsed illumination and the CW sustaining illumination in the plasma region 608 can be overlapped or can be distinct. In some embodiments, the bulb 602 is filled with Xenon gas. In some embodiments, the bulb 602 is formed in a spherical shape. Also, in some embodiments, a pressure in the bulb 602 filled with gas can be a pressure in a range of 20 atm to 50 atm. Referring back to FIG. 5, there illustrates a graph of the pulse energy and pump current threshold for a pump laser that creates a laser pulse sufficient to result in gas breakdown as a function of the pulse length for a passively Q-switched laser crystal suitable for an electrodeless laser-driven light source according to the present teaching.

Figure 7:
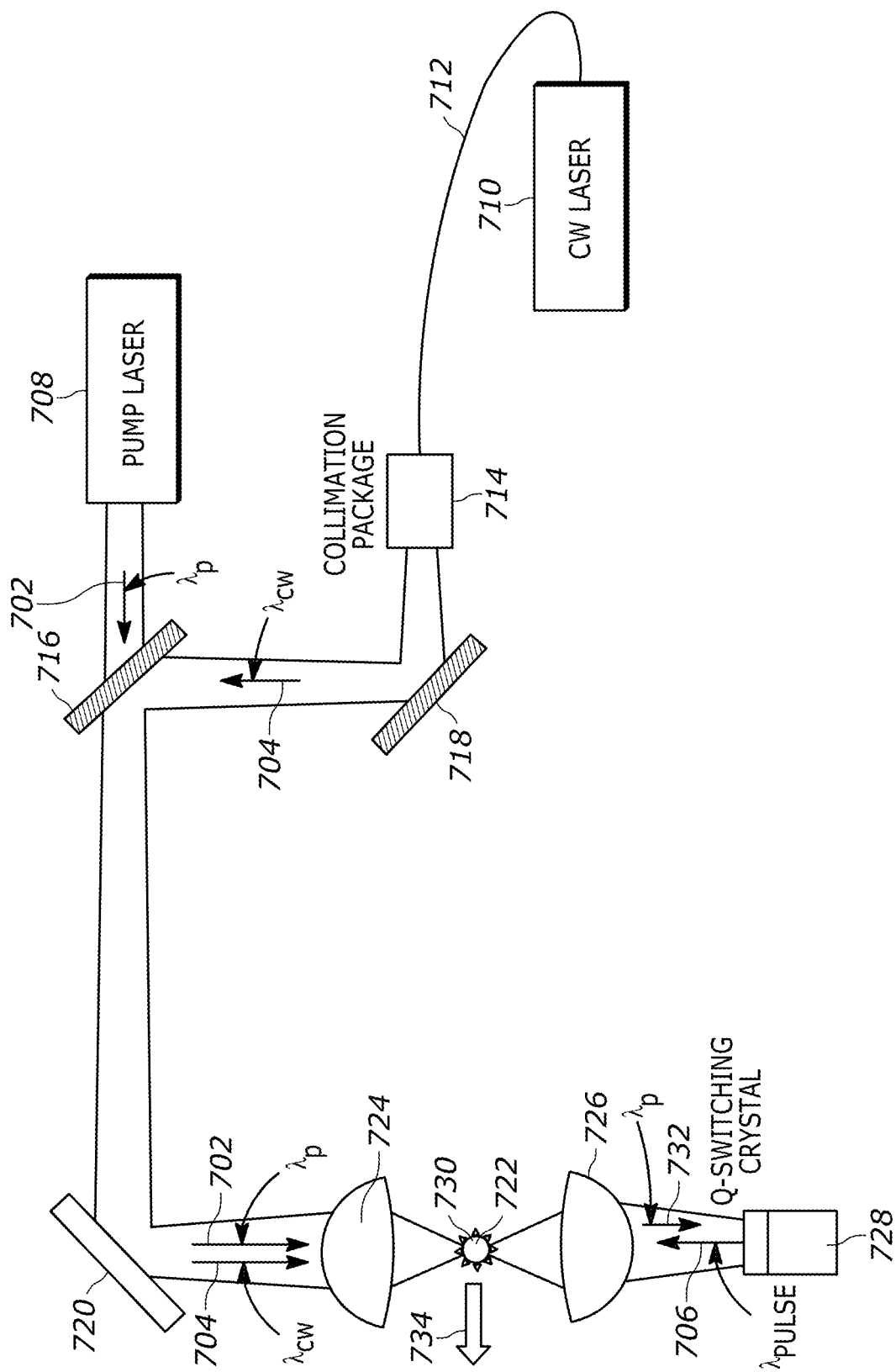
FIG. 7 illustrates an electrodeless laser-driven light source where a pump light is co-linear with CW laser light and a pulsed laser light is projected into the gas-filled bulb in one plane and the CW laser light is projected into the gas-filled bulb in a second plane according to the present teaching.

FIG. 7 illustrates an electrodeless laser-driven light source 700 where a pump light 702 is co-linear with CW laser light 704 and a pulsed laser light 706 is projected into the gas-filled bulb (not shown) in one plane and the CW laser light 704 is projected into the gas-filled bulb in a second plane according to the present teaching. A pump laser 708 generates pump light 702. In some embodiments, the pump light 702 is continuous light with a particular average power. A CW laser 710 generates CW light 704. The CW laser 710 can be a fiber laser and the light 704 is delivered via and optical fiber 712 into free space using a collimation package 714. The pump light 702 has a wavelength, $\lambda p$, the CW light 704 has a wavelength, $\lambda CW$, and the pulse laser light 706 has a wavelength $\lambda pulse$. A dichroic mirror 716 is used to combine the output light from the CW laser 710 and the pump laser 708 into co-linear propagation. An optional directing element 718 can be used to direct the light from the collimation package 714 to the dichroic mirror 716. The mirror 716 in some embodiments is a long-pass transmissive component with high transmission below around 900 nm and has high reflectance above about 900 nm. An optional directing mirror 720 can be used to project the colinear propagating pump light 702 and CW laser light 704 to a focusing element 724 and to a plasma sustaining region 722. A second focusing element 726 focuses pulse light 706 from a Q-switched crystal 728 into a breakdown region 730. The focusing element 726 also collimates and/or refocuses the pump light that passes through the gas 732 onto the Q-switched crystal 728. The figure illustrates that the plasma sustaining region 722 and the plasma breakdown region 730 overlap in this perspective view. However, the angles and/or planes of incidence and beam shapes of the CW light 704 and the pulsed light 706 can be adjusted so that the regions 730, 722 do not overlap or only partially overlap in a three-dimensional region in the gas. High brightness light 734 emerges from the CW plasma that is sustained by the CW sustaining light 704.

Figure 8:
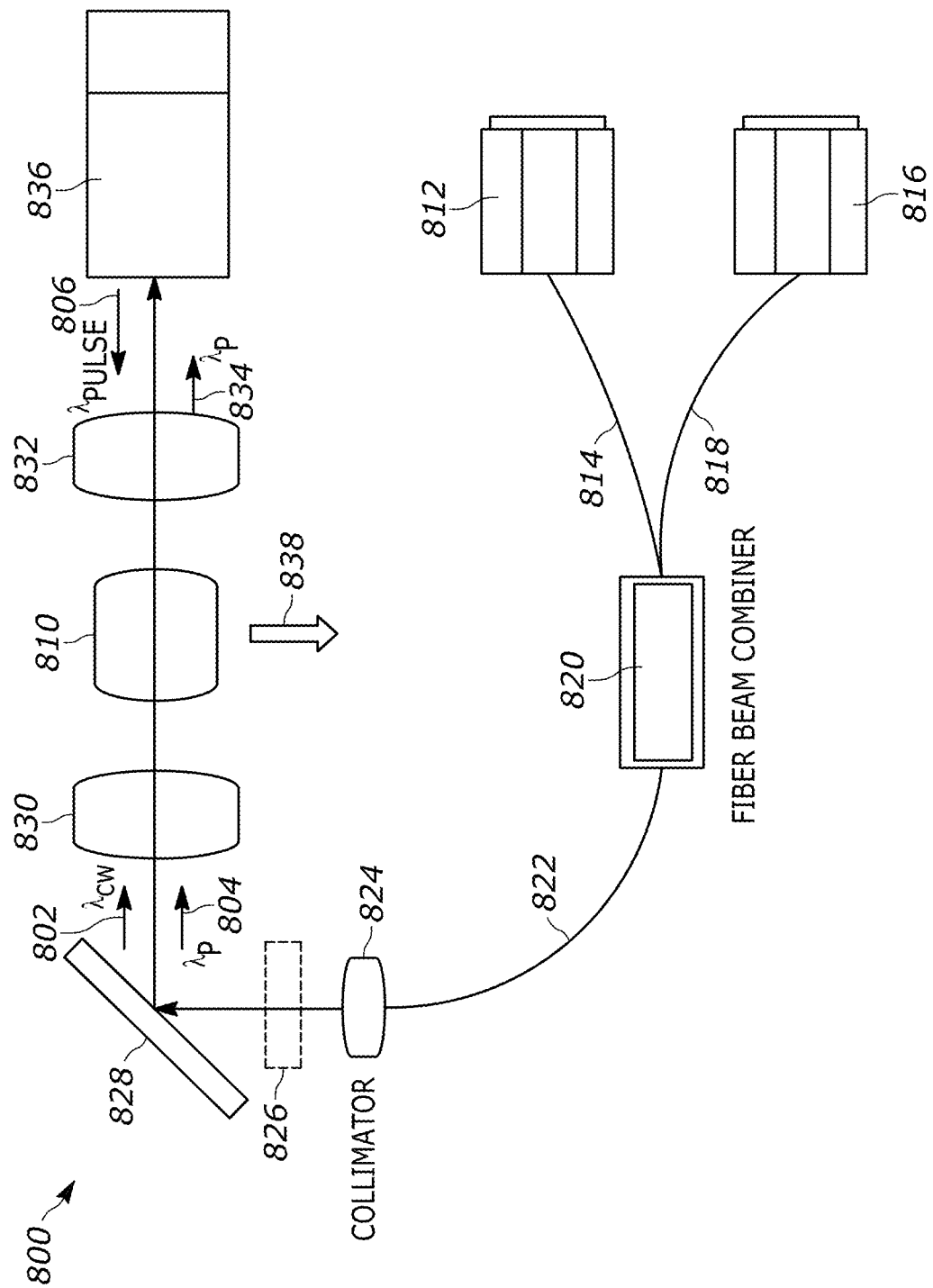
FIG. 8 illustrates an embodiment of an electrodeless laser-driven light source where the CW laser light and the pump light are combined in a fiber combiner and the pump light, the CW laser light, and the pulse light are projected into a gas-filled bulb along a same plane according to the present teaching.

FIG. 8 illustrates an embodiment of an electrodeless laser-driven light source 800 where the CW laser light 802 and the pump light 804 are combined in a fiber combiner 820 and the pump light 804, the CW laser light 802, and the pulse light 806 are projected into a gas-filled bulb 810 along a same plane according to the present teaching. A pump laser 812 has a fiber optic output 814. In some embodiments, the pump laser 812 is a fiber laser. In some embodiments, the pump laser 812 is a fiber-coupled diode, or other solid-state, laser. A CW laser 816 has a fiber optic output 818. In some embodiments, the CW laser 816 is a fiber laser. In some embodiments, the CW laser 816 is a fiber-coupled diode, or other solid-state, laser. In some embodiments the CW laser 816 is a pulsed laser having sufficiently high pulse rate so as to have quasi-continuous output light.

The light from the fibers 814, 818 at the output of the pump laser 812 and CW laser 816 are combined in a fiber beam combiner 820. In some embodiments, the fiber beam combiner 822 is a fused fiber combiner. The fiber output 822 of the fiber beam combiner 820 provides the combined CW laser light 802 and the pump light 804 and the combined light is collimated in a collimator 824. In some embodiments, the collimator 824 collimates light at nominally 980 nm wavelength from a ~100-micron fiber core to form a ~8-10 mm collimated beam. In some embodiments, the collimator 824 collimates light at nominally 808 nm wavelength from a ~100-micron fiber core to form a ~2-3 mm collimated beam. In some embodiments, the collimator 824 is a gradient index (GRIN) lens. An optional filter 826 can be used to prevent the pulse light 806 from entering either or both of the pump laser 812 or the CW laser 816.

An optional directing element 828, such as a mirror and a focusing element 830 are used to direct and/or focus the CW light 802 and the pump light into the gas-filled bulb 810. A focusing element 832 is used to direct and/or collimate the pump light 804 that passes through the gas-filled bulb 810, the through pump light 834, to a Q-switched crystal 836. The through pump light 806 causes the Q-switched crystal 836 to generate the pulsed light 806. The collimating element 832 projects the pulsed light 806 into the gas-filled bulb 810.

A break-down region is formed in the gas-filled bulb 810 where the pulse light 806 energy generates a breakdown of the gas. A sufficient density of ions and electrons from the break-down region in the bulb 810 absorb the CW light 802 in the bulb and seed a CW plasma. The CW plasma emits high brightness light 838 that is sustained by the CW light 802. The generation of the plasma in the bulb causes a reduction in the power of the through pump light 806. This extinguishes the generation of pulse light 806 from the Q-switch crystal 836.

Figure 9:
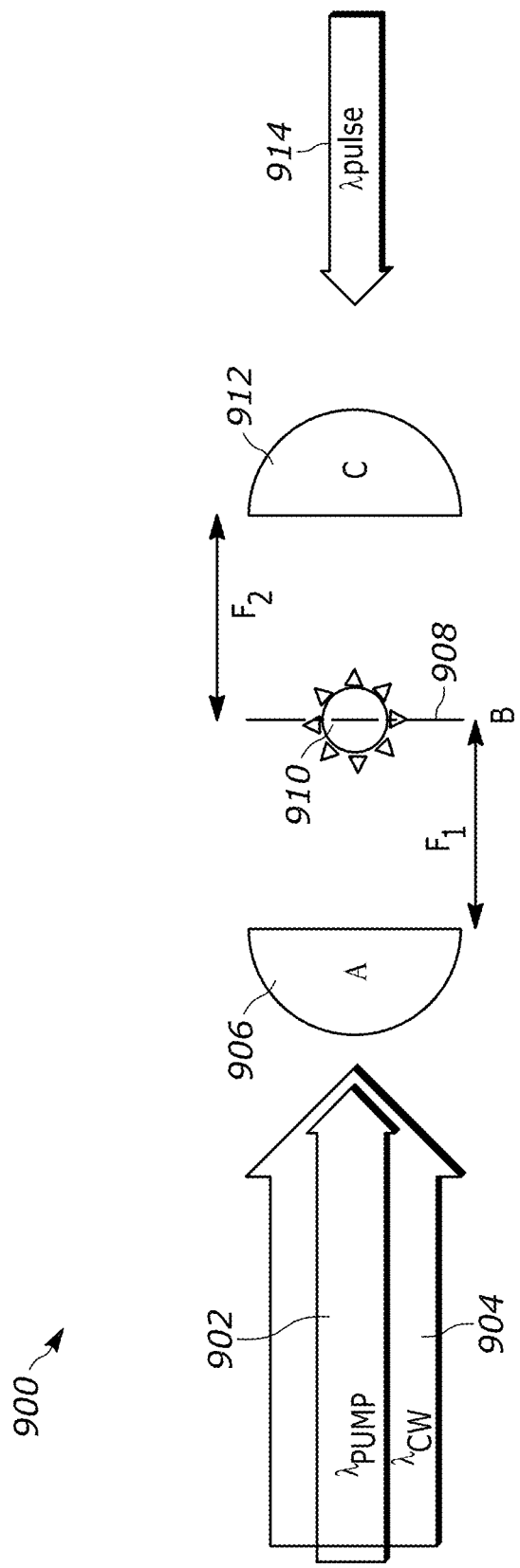
FIG. 9 illustrates a detail-view of the excitation region in an embodiment of an electrodeless laser-driven light source with co-linear laser excitation according to the present teaching.

One feature of the present teaching is that it is possible to support colinear propagation of all of the pump, CW and pulsed light beams and to have the focal position of the multiple wavelengths of these beams arranged to overlap at a plane. FIG. 9 illustrates a detail-view of the excitation region in an embodiment of an electrodeless laser-driven light source 900 with co-linear laser excitation according to the present teaching. The pump beam 902 and the CW light beam 904 are incident on a lens 906. In some embodiments, the pump beam 902 wavelength is 808 nm. In some embodiments, the CW laser light beam 904 is 980 nm wavelength. In some embodiments, the lens 906 is an aspheric lens. In some embodiments, the lens 906 is a nominally 0.5-inch aperture, f=10 mm (wavelength dependent), NA=0.55 lens. The lens 904 focuses the incoming optical beam at the CW light wavelength at the focal plane 908, B. The plasma sustaining region 910 is also located in this plane 908. A second lens 912 is positioned at a distance from the plane 908, B that is equal to a focal length of the lens 912 at a wavelength of the pulse light 914. In some embodiments, the pulsed light 914 wavelength is 1064 nm. Thus, even if the same lens element model is used for the lenses 906, 912, the position of the first lens 906 from the plane 908, B, and the position of the second lens 912 from the plane 908, B are different, because the focal length of the lenses 906, 912 are a function of wavelength. In some embodiments a width of the CW light beam 904 is larger than a width of the pump beam 902 that is larger than a width of the pulse light beam 914. Thus, the focused spot size of the CW light beam 904 is smaller than a spot size of the pump beam 902 that is smaller than a spot size of the pulse light beam 914 at the focal plane 908, B. In some embodiments a width of the CW light beam 904 is nominally 9 mm, a width of the pump beam 902 is nominally 3 mm and a width of the pulse light beam 914 is nominally 1 mm. In various embodiments, the spot size and/or beam width of the pulse light beam 914 is adjusted, based on the desired energy density required in the plasma breakdown region.

Figure 10:
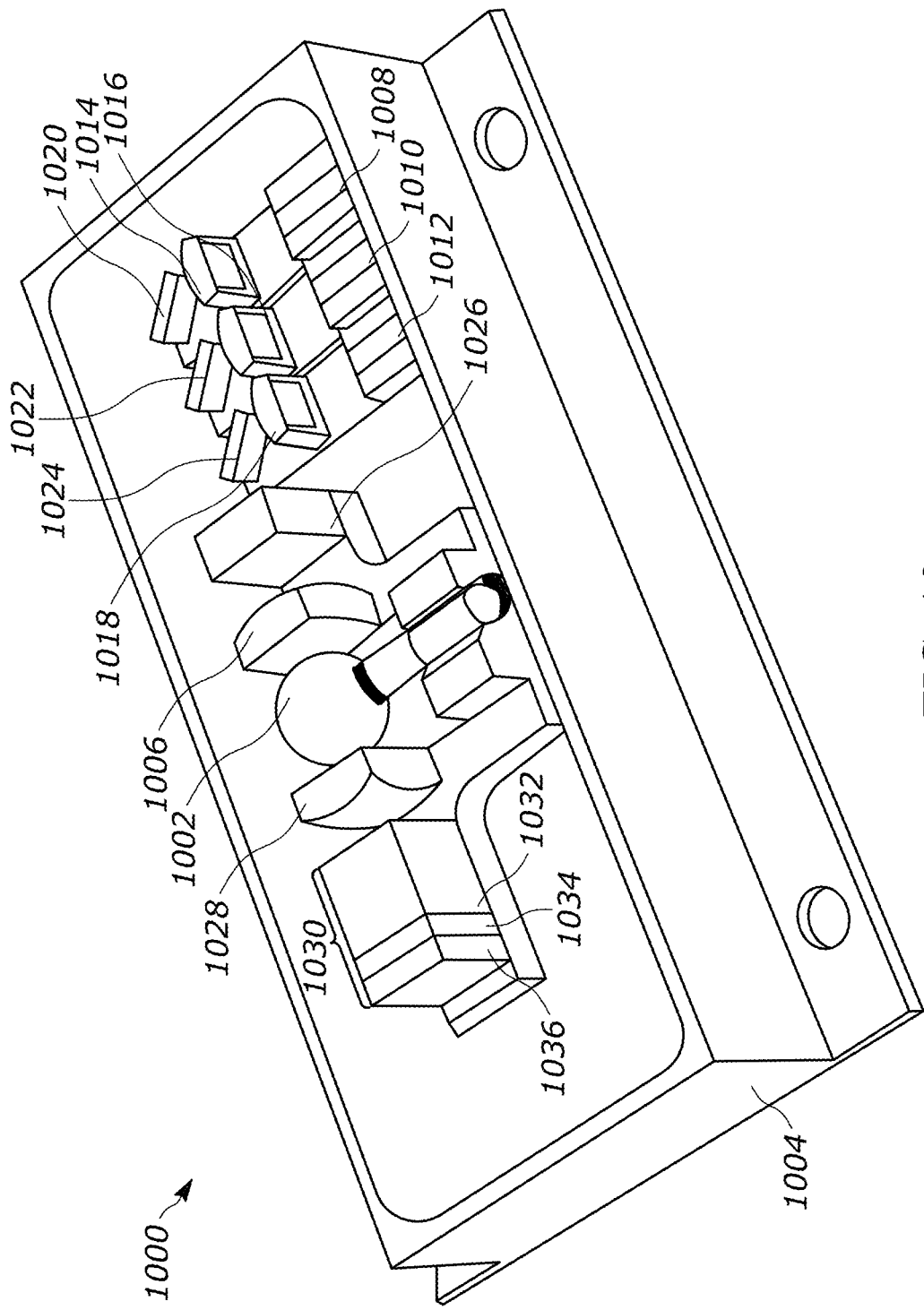
FIG. 10 illustrates an embodiment of a packaged electrodeless laser-driven light source with co-linear laser excitation according to the present teaching.

One feature of the all-optical electrodeless laser driven source of the present teaching is that it can be configured to fit in a single optical package. FIG. 10 illustrates an embodiment of a packaged electrodeless laser-driven light source 1000 with co-linear laser excitation according to the present teaching. A high-pressure electrodeless Xenon gas-filled bulb 1002 is positioned in a package 1004. A focusing lenses 1006 is used to focus pump light generated by a pump laser diode 1008 and CW light generated by laser diodes 1010, 1012. The light from the laser diodes 1008, 1010, 1012 is collimated with collimating optics 1014, 1016, 1018. The pump light is directed by a mirror 1020, and the CW light is combined and made collinear with the pump beam path by dichroic elements 1022, 1024. A filter 1026 passes the pump light and the CW light, but blocks the pulse light. A focusing lens 1028 focuses pulses generated in a Q-switched crystal 1030 to a breakdown region in the Xenon gas-filled bulb 1002. The Q-switched crystal includes a Yb:YAG rod section and a Cr:YAG or V:YAG saturable absorber section 1034. A high-reflective coating 1036 is applied to the end of the crystal 1030.

EQUIVALENTS

While the Applicant's teaching is described in conjunction with various embodiments, it is not intended that the Applicant's teaching be limited to such embodiments. On the contrary, the Applicant's teaching encompasses various alternatives, modifications, and equivalents, as will be appreciated by those of skill in the art, which may be made therein without departing from the spirit and scope of the teaching.

What is claimed is:

1. An electrodeless laser-driven light source comprising:
    a) a sustaining laser source that generates a continuous wave (CW) sustaining light at an output;
    b) a pump laser that generates a pump light at an output;
    c) an optical beam combiner having a first input that is optically coupled to the output of the sustaining laser source and a second input that is optically coupled to the output of the pump laser, the optical beam combiner combining the CW sustaining light and the pump light at an output such that the CW sustaining light and the pump light propagate co-linearly;
    d) a Q-switched laser crystal having a pump input optically coupled to the output of the pump laser and configured such that the Q-switched laser crystal generates pulsed light at an output in response to the pump light; and
    e) a gas-filled bulb optically coupled to the output of the sustaining laser and optically coupled to the output of the Q-switched laser crystal such that the pulsed light ignites a pulse plasma in a breakdown region of the gas bulb and the sustaining light sustains a CW plasma in a CW plasma region of the gas bulb, thereby emitting a high brightness light from the gas bulb, wherein
        the gas-filled bulb is positioned between the output of the pump laser and the pump input of the Q-switched laser crystal such that the CW plasma absorbs the pump light, thereby quenching the pulsed light generated by the Q-switched laser crystal.

2. The electrodeless laser-driven light source of claim 1 wherein the sustaining laser source and the pump laser comprise a same laser.

3. The electrodeless laser-driven light source of claim 1 wherein the sustaining laser source and the pump laser are configured in one laser housing.

4. The electrodeless laser-driven light source of claim 1 wherein the optical combiner comprises a dichroic beam splitter.

5. The electrodeless laser-driven light source of claim 1 wherein the optical combiner comprises a fiber coupler.

6. The electrodeless laser-driven light source of claim 1 wherein the Q-switched laser crystal is configured so that a pulse repetition rate of the pulse laser light is in a range of 1 kHz to 20 kHz.

7. The electrodeless laser-driven light source of claim 1 wherein the Q-switched laser crystal is configured so that a pulse repetition rate of the pulse laser light is in a range less than or equal to 1 kHz.

8. The electrodeless laser-driven light source of claim 1 wherein the Q-switched laser crystal is configured so that a pulse energy of the pulsed laser light is in a range of 350 µJoules to 50 mJoules.

9. The electrodeless laser-driven light source of claim 1 wherein the Q-switched laser crystal is configured so that a pulse duration of the pulse laser light is in a range of 0.1 ns to 10 ns.

10. The electrodeless laser-driven light source of claim 1 wherein the laser source is configured so that a power of the CW sustaining light is in a range of 5 W to 50 W.

11. The electrodeless laser-driven light source of claim 1 wherein the laser source is configured so that a power of the CW sustaining light is in a range of 5 W to 1500 W.

12. The electrodeless laser-driven light source of claim 1 wherein the Q-switched laser crystal comprises a gain section and a saturable absorber section.

13. The electrodeless laser-driven light source of claim 1 wherein the Q-switched laser crystal comprises at least one of a glass host, an yttrium aluminum garnet host, and a spinel host.

14. The electrodeless laser-driven light source of claim 1 wherein the Q-switched laser crystal comprises at least one of a chromium dopant, a cobalt dopant, and a vanadium dopant.

15. The electrodeless laser-driven light source of claim 1 wherein the Q-switched laser crystal comprises a narrow-band filter.

16. The electrodeless laser-driven light source of claim 15 wherein the narrow-band filter reflects at least some of the plasma light.

17. The electrodeless laser-driven light source of claim 15 wherein the narrow-band filter blocks wavelengths in the Xenon spectrum.

18. The electrodeless laser-driven light source of claim 1 wherein the gas-filled bulb comprises Xenon gas.

19. The electrodeless laser-driven light source of claim 1 wherein the gas-filled bulb comprises a noble gas.

20. The electrodeless laser-driven light source of claim 1 wherein the gas-filled bulb is formed in a spherical shape.

21. The electrodeless laser-driven light source of claim 1 wherein a pressure in the gas-filled bulb is in a range of 20 atm. to 50 atm.

22. A method of igniting an electrodeless laser-driven light source, the method comprising:
 a) providing electromagnetic energy to a gas within a gas-filled bulb using a continuous CW laser light;
 b) providing laser pump radiation to a Q-switched laser crystal, thereby generating laser pulses;
 c) providing the laser pulses to the gas within the gas-filled bulb to generate a pulse plasma in a breakdown region in the gas;
 d) producing a CW plasma that emits a high-brightness light in a CW plasma region using the provided electromagnetic energy to the ionized gas and the pulse plasma; and
 e) passing the laser pump radiation that is provided to the Q-switched laser crystal through the CW plasma region such that the CW plasma absorbs the pump light, thereby quenching the pulsed light generated by the Q-switched laser crystal.

23. The method of igniting the electrodeless laser-driven light source of claim 22 wherein the providing electromagnetic energy to a gas within a gas-filled bulb and the providing laser pump radiation to a Q-switched laser crystal comprise using a same laser to provide the electromagnetic energy and the pump radiation.

24. The method of igniting the electrodeless laser-driven light source of claim 22 wherein the breakdown region and the CW plasma region overlap.

25. The method of igniting the electrodeless laser-driven light source of claim 22 wherein the breakdown region and the CW plasma region do not overlap.

26. The method of igniting the electrodeless laser-driven light source of claim 22 wherein a pulse repetition rate of the laser pulses is in a range less than or equal to 1 kHz.

27. The method of igniting the electrodeless laser-driven light source of claim 22 wherein a pulse repetition rate of the laser pulses is in a range of 1 kHz to 20 kHz.

28. The method of igniting the electrodeless laser-driven light source of claim 22 wherein a pulse energy of the laser pulses is in a range of 350 µJoules to 50 mJoules.

29. The method of igniting the electrodeless laser-driven light source of claim 22 wherein a pulse duration of the laser pulses is in a range of 0.1 ns to 10 ns.

30. The method of igniting the electrodeless laser-driven light source of claim 22 wherein a power of the continuous CW laser light is in a range of 5 W to 1500 W.

* * * * *